US012677620B2

(12) United States Patent
Okumura et al.

(10) Patent No.: US 12,677,620 B2

(45) Date of Patent: Jul. 7, 2026

(54) SURFACE TREATMENT METHOD FOR SEMICONDUCTOR SUBSTRATE AND SURFACE TREATMENT AGENT COMPOSITION

(71) Applicant: CENTRAL GLASS COMPANY, LIMITED, Ube (JP)

(72) Inventors: Yuzo Okumura, Ube (JP); Yuki Fukui, Ube (JP); Saori Shiota, Ube (JP); Yoshiharu Terui, Ube (JP); Soichi Kumon, Ube (JP)

(73) Assignee: CENTRAL GLASS COMPANY, LIMITED, Ube (JP)

( * ) Notice: Subject to any disclaimer, the term of this patent is extended or adjusted under 35 U.S.C. 154(b) by 804 days.

(21) Appl. No.: 17/999,361

(22) PCT Filed: May 19, 2021

(86) PCT No.: PCT/JP2021/018945

§ 371 (c)(1),
(2) Date: Nov. 18, 2022

(87) PCT Pub. No.: WO2021/235476

PCT Pub. Date: Nov. 25, 2021

(65) Prior Publication Data

US 2023/0282473 A1 Sep. 7, 2023

(30) Foreign Application Priority Data

May 21, 2020 (JP) ................................ 2020-089194
May 21, 2020 (JP) ................................ 2020-089201

(51) Int. Cl.
*H10P 70/00* (2026.01)
*C09D 7/20* (2018.01)
*C09D 183/08* (2006.01)

(52) U.S. Cl.
CPC ................ *H10P 70/23* (2026.01); *C09D 7/20* (2018.01); *C09D 183/08* (2013.01)

(58) Field of Classification Search
None
See application file for complete search history.

(56) References Cited

U.S. PATENT DOCUMENTS 7,749,909 B2 7/2010 Tomita et al.
7,838,425 B2 11/2010 Tomita et al.
(Continued)

FOREIGN PATENT DOCUMENTS

JP 2010-114414 5/2010
JP 2013118347 A * 6/2013 ......... C11D 11/0047
(Continued)

OTHER PUBLICATIONS

Japanese Office Action, issued in the corresponding Japanese patent application No. 2022-524512, dated Feb. 18, 2025, 8 pages with the machine translation.
(Continued)

*Primary Examiner* — Michael Lebentritt
(74) *Attorney, Agent, or Firm* — HSML P.C.

(57) ABSTRACT

A surface treatment method for a semiconductor substrate of the present invention is a treatment method of treating a main surface of a semiconductor substrate that has, on the main surface of the substrate, a pattern formation region in which a pattern having a concave-convex structure with a pattern dimension of 30 nm or less is formed and a pattern non-formation region in which no pattern is formed, the method including a surface treatment step of bringing a surface treatment agent composition including a silylating agent into contact with the pattern formation region and the pattern non-formation region on the main surface of the semiconductor substrate, in which, with respect to a surface (Continued)

of the pattern non-formation region after the surface treatment step, an IPA contact angle with 2-propanol is 2° or more at a room temperature of 25° C. and/or a water contact angle with pure water is 50° or more at the room temperature of 25° C.

15 Claims, 3 Drawing Sheets

(56) References Cited

U.S. PATENT DOCUMENTS

| | | | |
|---|---|---|---|
| 7,985,683 B2 | 7/2011 | Tomita et al. | |
| 8,956,465 B2 | 2/2015 | Nonaka | |
| 10,593,538 B2 | 3/2020 | Wojtczak et al. | |
| 2009/0250815 A1* | 10/2009 | Yang | H01L 21/76829 257/E23.162 |
| 2009/0311874 A1 | 12/2009 | Tomita et al. | |
| 2010/0075504 A1 | 3/2010 | Tomita et al. | |
| 2010/0240219 A1 | 9/2010 | Tomita et al. | |
| 2012/0171862 A1* | 7/2012 | Ou | H01L 23/53295 438/653 |
| 2013/0255534 A1 | 10/2013 | Ryokawa et al. | |
| 2014/0338706 A1 | 11/2014 | Nonaka | |
| 2017/0062203 A1 | 3/2017 | Ryokawa et al. | |
| 2018/0277357 A1 | 9/2018 | Wojtczak et al. | |
| 2020/0035494 A1 | 1/2020 | Wojtczak et al. | |

FOREIGN PATENT DOCUMENTS

| | | | |
|---|---|---|---|
| JP | 2017-174859 | 9/2017 | |
| JP | 2023027033 A * | 3/2023 | B08B 3/08 |
| KR | 2000-0027277 | 5/2000 | |
| WO | 2013/080832 | 6/2013 | |
| WO | 2013/132881 | 9/2013 | |
| WO | WO-2015049956 A1 * | 4/2015 | B08B 3/08 |
| WO | WO-2017030073 A1 * | 2/2017 | C11D 3/162 |
| WO | WO-2017159407 A1 * | 9/2017 | |
| WO | WO-2017159416 A1 * | 9/2017 | |
| WO | WO-2017159447 A1 * | 9/2017 | C07F 7/10 |
| WO | 2018/175682 | 9/2018 | |
| WO | 2018/193841 | 10/2018 | |
| WO | WO-2022181530 A1 * | 9/2022 | C07F 7/02 |

OTHER PUBLICATIONS

Extended European Search Report, issued in the corresponding European patent application No. 21809701.2, dated Jun. 24, 2024, 8 pages.

First Chinese Office Action, issued in the corresponding Chinese patent application No. 202180036504.7, dated May 22, 2025, 28 pages with the machine translation.

International Search Report of PCT/JP2021/018945, Jul. 13, 2021, 2 pages.

Korean Office Action, issued in the corresponding Korean patent application No. 2022-7044864, dated Apr. 15, 2026, 24 pages.

* cited by examiner

SURFACE TREATMENT METHOD FOR SEMICONDUCTOR SUBSTRATE AND SURFACE TREATMENT AGENT COMPOSITION

TECHNICAL FIELD

The present invention relates to a surface treatment method for a semiconductor substrate and a surface treatment agent composition.

BACKGROUND ART

So far, various developments have been made on a surface treatment method for a semiconductor substrate. As this kind of technique, for example, a technique disclosed in Patent Document 1 has been known. Patent Document 1 discloses a method of evaluating a water contact angle of a dummy substrate without a pattern, apart from a Si substrate on which a Si pillar pattern is formed on the entire surface, by surface-treating a surface of the dummy substrate on which a $SiO_2$ film or a SiN film is formed on a Si substrate (Examples of Patent Document 1).

RELATED DOCUMENT

Patent Document

[Patent Document 1] International Publication No. WO 2018/175682

SUMMARY OF THE INVENTION

Technical Problem

However, as a result of studies by the present inventor, it has been found that, in the surface treatment method for a semiconductor substrate disclosed in Patent Document 1, there is room for improvement in terms of manufacturing controllability and manufacturing stability.

Solution to Problem

As a result of further studies by the present inventor, the following findings have been obtained.

In a case of using a semiconductor substrate that has, on a main surface, a pattern formation region on which a fine pattern is formed and a pattern non-formation region, a surface of the pattern formation region can be surface-treated, and a contact angle with 2-propanol (hereinafter, also referred to as an IPA contact angle) or a contact angle with pure water (hereinafter, also referred to as a water contact angle) on a surface of the pattern non-formation region after the surface treatment can be measured. That is, since it is possible to evaluate the surface treatment on the pattern and the IPA contact angle or the water contact angle on the surface after the surface treatment on the same semiconductor substrate, management of a manufacturing process is easier compared with a case of using another dummy substrate.

As a result of intensive studies based on such findings, it has been found that, by adopting the IPA contact angle or the water contact angle on the surface in the pattern non-formation region as an index, a pattern collapse rate in the pattern formation region can be evaluated stably, and by setting the IPA contact angle or the water contact angle within a specified range, a pattern collapse can be suppressed, and the present invention has been completed.

According to the present invention, a treatment method of treating a main surface of a semiconductor substrate that has, on the main surface of the substrate, a pattern formation region in which a pattern having a concave-convex structure with a pattern dimension of 30 nm or less is formed and a pattern non-formation region in which no pattern is formed, the method including a surface treatment step of bringing a surface treatment agent composition including a silylating agent into contact with the pattern formation region and the pattern non-formation region on the main surface of the semiconductor substrate, in which, with respect to a surface of the pattern non-formation region after the surface treatment step, an IPA contact angle with 2-propanol is 2° or more at a room temperature of 25° C. and/or a water contact angle with pure water is 50° or more at the room temperature of 25° C., is provided.

In addition, according to the present invention, a surface treatment agent composition used for treating a main surface of a semiconductor substrate that has, on the main surface of the substrate, a pattern formation region in which a pattern having a concave-convex structure with a pattern dimension of 30 nm or less is formed and a pattern non-formation region in which no pattern is formed, the surface treatment agent composition including a silylating agent, in which an IPA contact angle obtained by the following procedure is 2° or more and/or a water contact angle obtained by the following procedure is 50° or more, is provided.

(Procedure)

The surface treatment agent composition is brought into contact with the pattern formation region and the pattern non-formation region on the main surface of the semiconductor substrate.

After contacting the surface treatment agent composition, on the surface of the pattern non-formation region, a contact angle with 2-propanol is measured at a room temperature of 25° C. and a value of the contact angle is defined as the IPA contact angle (°), and a contact angle with pure water is measured at the room temperature of 25° C. and a value of the contact angle is defined as the water contact angle (°).

Advantageous Effects of Invention

According to the present invention, a surface treatment method for a semiconductor substrate, which is excellent in manufacturing controllability and manufacturing stability, and a surface treatment agent composition used therein.

DESCRIPTION OF EMBODIMENTS

Figure 1:
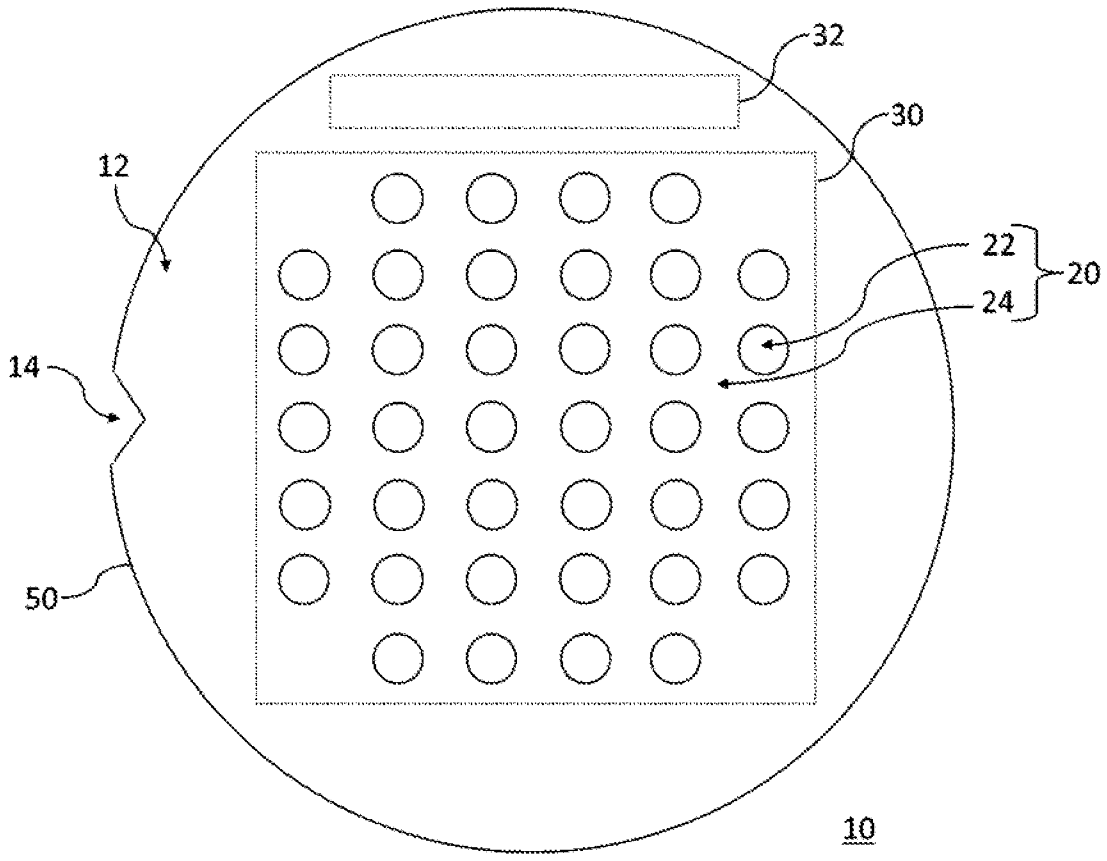
FIG. 1 is a top view schematically showing a configuration of a semiconductor substrate.

Hereinafter, embodiments of the present invention will be described with reference to the drawings. In all drawings, the same components are designated by the same reference numerals, and description thereof will not be repeated. In addition, the drawings are schematic views and do not match the actual dimensional ratio.

A surface treatment method for semiconductor substrates according to the present embodiment is a treatment method of treating a main surface of a semiconductor substrate that has, on the main surface of the substrate, a pattern formation region in which a pattern having a concave-convex structure with a pattern dimension of 30 nm or less is formed and a pattern non-formation region in which no pattern is formed.

The treatment method includes a surface treatment step of bringing a surface treatment agent composition including a silylating agent into contact with the pattern formation region and the pattern non-formation region on the main surface of the semiconductor substrate, in which, with respect to a surface of the pattern non-formation region after the surface treatment step, an IPA contact angle with 2-propanol is 2° or more at a room temperature of 25° C. and/or a water contact angle with pure water is 50° or more at the room temperature of 25° C.

The surface treatment method disclosed in EXAMPLES and the like in Patent Document 1 is a method in which a smooth surface of a dummy substrate is surface-treated with a surface treatment composition to evaluate the water contact angle, and separately, a patterned surface of a substrate is surface-treated with the surface treatment composition to evaluate a collapse-free rate of the pattern. In order to confirm whether a predetermined water repellency is exhibited, it is necessary to separately evaluate the water contact angle using a smooth dummy substrate, and the present inventors have found that a more efficient manufacturing method (simplification of process control) is desired.

According to the findings of the present inventors, the treatment method according to the present embodiment targets a semiconductor substrate which has a smooth pattern non-formation region in which no pattern is formed around an orientation flat, a notch, an outer peripheral portion of a wafer, and the like, and evaluates the contact angle in the pattern non-formation region of the substrate. Further, the treatment method according to the present embodiment evaluates the collapse-free rate in the pattern formation region on which the pattern is formed, which is a more efficient manufacturing method. That is, compared to the conventional complicated manufacturing method in which the water contact angle is separately evaluated using a smooth dummy substrate, the manufacturing method according to the present disclosure does not require the evaluation of the smooth dummy substrate, and by using the same substrate as the semiconductor substrate to be surface-treated, it is possible to evaluate a part of the surface after the surface treatment (surface of the dried pattern non-formation region after the surface treatment or rinsing), so that it can be said that the manufacturing method according to the present disclosure is a more efficient manufacturing method (process control is simplified).

An area of the pattern non-formation region per measurement point of the contact angle in the semiconductor substrate to be treated is preferably 200 $mm^2$ or more, more preferably 300 $mm^2$ or more, still more preferably 350 $mm^2$ or more, and particularly preferably 400 $mm^2$ or more.

In addition, isopropanol (IPA) or water may be used as a rinsing solution after the surface treatment ("second rinsing solution" described later), and in such an embodiment, in order to further reduce capillary force acting on the pattern during IPA or water drying, and thus to further suppress collapse of the pattern, the present inventors have found that it is desirable that the IPA contact angle of a surface treatment agent layer formed by the surface treatment is larger and/or the water contact angle of the surface treatment agent layer formed by the surface treatment is larger.

In addition, in some embodiments, a rinsing may be performed sequentially with water and IPA as rinsing solutions after the surface treatment ("second rinsing solution" described later) (for example, "surface treatment→water rinse→IPA rinse", "surface treatment→IPA rinse→water rinse", or the like), in such an embodiment, the present inventors have found that a larger IPA contact angle and a larger water contact angle is desired.

The treatment method according to another embodiment of the present invention is a treatment method of treating a main surface of a semiconductor substrate that has, on the main surface of the substrate, a pattern formation region in which a pattern having a concave-convex structure with a pattern dimension of 30 nm or less is formed and a pattern non-formation region in which no pattern is formed, the method including a surface treatment step of bringing a surface treatment agent composition including a silylating agent into contact with the pattern formation region and the pattern non-formation region on the main surface of the semiconductor substrate, and an evaluation step of determining whether or not, with respect to a surface of the pattern non-formation region after the surface treatment step, an IPA contact angle with 2-propanol is 2° or more and/or a water contact angle with pure water is 50° or more.

In the evaluation step, the modified state on the surface of the semiconductor substrate can be evaluated using the IPA contact angle or the water contact angle as an index, and in a case where it is determined that one or both of these values are a predetermined value or more, the subsequent substrate treating process can proceed. Examples of the subsequent processes include a second rinsing step, a drying step, a removal step, and a known substrate surface treatment which has not yet been performed. In addition, in a case where the value is not the predetermined value or more, the evaluation step may be performed after the surface treatment step is performed again.

Therefore, it is not necessary to evaluate the contact angle using a dummy substrate, which has been performed separately, and it is possible to determine the progress of the process in the manufacturing line, which facilitates the manufacturing controllability. In addition, after the process is advanced, the pattern collapse in the pattern formation region can be suppressed, so that the manufacturing stability can be improved.

In the present invention, on the surface of the pattern non-formation region of the main surface after the surface treatment, the IPA contact angle at the room temperature of 25° C. is 2° or more, preferably 3° or more, and/or the water contact angle at the room temperature of 25° C. is 50° or more, preferably 55° or more and more preferably 60° or more. As a result, it is possible to reduce the pattern collapse rate in the pattern formation region.

On the other hand, the above-described IPA contact angle may be, for example, 10° or less, and the above-described water contact angle may be, for example, 110° or less or 99° or less.

The IPA contact angle and the water contact angle can be measured on the surface of the surface treatment agent layer formed in the pattern non-formation region by the surface treatment step.

A measurement timing after the surface treatment may be immediately after the surface treatment step of bringing the surface treatment agent composition into contact with the main surface of the semiconductor substrate, immediately after the post-rinsing step performed after the surface treatment step, or immediately after the subsequent drying step. The timing of measuring the contact angle may be immediately before the surface treatment agent layer is removed, or immediately after the surface treatment agent composition or other liquid is removed on the surface of the pattern non-formation region. At least one of these timings may be adopted.

In the present specification, "immediately after" or "immediately before" means within 24 hours, preferably within 2 hours and particularly preferably within 30 minutes.

In addition, according to the surface treatment method of the present invention, a standard deviation of the IPA contact angle at 10 parts predetermined pattern non-formation regions can be configured to be, for example, 2° or less. In addition, a difference between the maximum value and the minimum value of the IPA contact angle can be configured to be, for example, 5° or less.

Similarly, a standard deviation of the water contact angle at 10 parts predetermined pattern non-formation regions can be configured to be, for example, 2° or less. In addition, a difference between the maximum value and the minimum value of the water contact angle can be configured to be, for example, 5° or less.

In the manufacturing process of forming a semiconductor element on the semiconductor substrate (wafer), it is known that foreign matter (particles) such as metal particles and inorganic particles adhere to the bevel or the like located at the edge portion of the semiconductor wafer.

By forming the surface treatment agent layer having the above-described IPA contact angle and/or water contact angle also on the main surface of the pattern non-formation region and/or the bevel region, it is possible to reduce reattachment of the foreign matters to the bevel region or the pattern non-formation region.

In addition, a surface treatment agent composition according to the present embodiment is used for treating a main surface of a semiconductor substrate that has, on the main surface of the substrate, a pattern formation region in which a pattern having a concave-convex structure with a pattern dimension of 30 nm or less is formed and a pattern non-formation region in which no pattern is formed.

Such a surface treatment agent composition includes a silylating agent and is configured to set an IPA contact angle obtained by the following procedure is 2° or more, and/or a water contact angle obtained by the following procedure is 50° or more.

The IPA contact angle and the water contact angle are determined by the following procedure.

The surface treatment agent composition is brought into contact with the pattern formation region and the pattern non-formation region on the main surface of the semiconductor substrate.

After contacting the surface treatment agent composition, with respect to the surface of the pattern non-formation region, a contact angle in a case of using 2-propanol is measured at a room temperature of 25° C. and a value of the contact angle is defined as the IPA contact angle (°), and a contact angle in a case of using pure water is measured at the room temperature of 25° C. and a value of the contact angle is defined as the water contact angle (°).

The IPA contact angle or the water contact angle is a value of a static contact angle, which is obtained by dropping 1 μl of droplets of 2-propanol or pure water on the substrate surface of the pattern non-formation region, specifically, the surface of the surface treatment agent layer formed in the pattern non-formation region at the room temperature of 25° C. in a state in which the semiconductor substrate is stood on a horizontal table, and then measuring after 5 seconds.

The procedure for measuring the above-described contact angle is usually used to evaluate characteristics of the surface treatment agent composition.

In the above-described evaluation step in the treatment method, measurement conditions of one point selected from any of a measurement temperature of the contact angle of 23° C.±5° C., a droplet amount of 0.1 μl to 5 μl, and a measurement timing after the dropping of 0.1 seconds to 30 seconds can be applied to the procedure for measuring the above-described contact angle.

In the present embodiment, for example, by appropriately selecting the type and blending amount of each component included in the surface treatment agent composition, the preparation method of the surface treatment agent composition, or the like, it is possible to control the IPA contact angle and/or water contact angle described above. Among these, examples of a factor for setting the IPA contact angle and/or water contact angle described above into a desired numerical range include appropriately selecting the type of the silylating agent and other components and mixing composition components and using immediately after the preparation.

By the surface treatment method using the surface treatment agent composition according to the present embodiment, it is possible to realize a method for manufacturing a semiconductor substrate having excellent manufacturing controllability and manufacturing stability.

(Method for Manufacturing Semiconductor Substrate)

Hereinafter, the method for manufacturing a semiconductor substrate according to the present embodiment will be described in detail.

Examples of the method for manufacturing a semiconductor substrate include a method of performing, on a main surface of a semiconductor substrate, a pattern formation, a pre-rinsing (first rinsing) step, a surface treatment step with a surface treatment agent composition, a post-rinsing (second rinsing) step, a drying step, a removal of a surface treatment agent layer, and the like.

Hereinafter, each step will be described with reference to FIGS. 1 to 3.

FIG. 1 is a top view of a substrate 10 (semiconductor substrate) from a direction perpendicular to a main surface 12. FIG. 2 is a schematic cross-sectional view of the substrate 10 in a predetermined direction. FIGS. 3A to 3C are schematic process cross-sectional views in a process of manufacturing the semiconductor substrate.

First, the substrate 10 having a pattern (concave-convex structure 20) formed on the main surface 12 is prepared.

In the above-described preparation step of the substrate 10, the following method, which is an example of a method of forming the concave-convex structure 20 on the surface of the substrate 10, may be used.

First, a resist is applied to a surface of a wafer, and then the resist is exposed through a resist mask. Thereafter, by removing the exposed resist or the unexposed resist, a resist having a desired concave-convex pattern is produced. In addition, the resist having a concave-convex pattern can also be obtained by pressing a mold having a pattern against the resist. Next, the wafer is etched. At this time, the substrate surface corresponding to the concave portion of the resist pattern is selectively etched. Finally, in a case of peeling off the resist, a wafer (substrate 10) having the concave-convex structure 20 on the surface is obtained.

The wafer on which the concave-convex structure 20 is formed and the material of the concave-convex structure 20 are not particularly limited.

As the material of the wafer, various wafers such as a silicon wafer, a silicon carbide wafer, a wafer composed of a plurality of components including a silicon element, a sapphire wafer, and a semiconductor wafer including various compounds can be used.

As the material of the concave-convex structure 20, one or two or more kinds selected from the group consisting of Si, Ti, Ge, W, Ru, and oxides, nitrides, nitrogen oxides, carbonitrides, or carbide oxides, which include one or more kinds of these elements, may be included. For example, as the material of the concave-convex structure 20, silicon-based materials such as silicon oxide, silicon nitride, polycrystalline silicon, single crystalline silicon, and silicon germanium; metal-based materials such as titanium nitride, tungsten, ruthenium, tantalum nitride, and tin; materials obtained by combining these materials; resist (photoresist) materials; and the like can be used.

The substrate 10 of FIG. 1 has, on the main surface 12, a pattern formation region 30 in which the pattern (concave-convex structure 20) is formed and a pattern non-formation region 32 in which the pattern is not formed.

In the substrate 10 of FIG. 1, a notch portion 14 may be formed in a part of the peripheral portion. For the purpose of positioning in an exposure apparatus or the like, the notch portion 14 may be formed with a straight cut called as an orientation flat, which indicates a direction of a crystal axis, or a V-shaped cut called as a notch.

The pattern formation region 30 is a region in which one or two or more concave-convex structures 20 are formed in a case of being viewed from a direction perpendicular to the main surface 12, that is, in a top view. The pattern formation region 30 may include an element formation region in which one or two or more semiconductor elements are formed.

For example, the concave-convex structure 20 may be constituted of one or two or more structures arranged along a vertical direction of the main surface 12 and/or of a three-dimensional structure having one or two or more structures arranged along a horizontal direction orthogonal to the vertical direction. As an example of such a three-dimensional structure, at least a part of a logic device or a memory device may be configured, and examples thereof include FinFETs, nanowire FETs, nanosheet FETs, other multigate FETs, and three-dimensional memory cells.

The pattern non-formation region 32 is a region formed on at least a part of an outer circumference of the pattern formation region or the entire outer circumference thereof in the top view. The pattern non-formation region 32 may be formed continuously with each other or may be divided into a plurality of portions.

The pattern non-formation region 32 has a smooth surface region in which the concave-convex structure 20 is not formed at least in part.

In the pattern formation region 30 and/or between the pattern formation region 30 and the pattern non-formation region 32, one or two or more cut regions for dicing may be formed.

Figure 2:
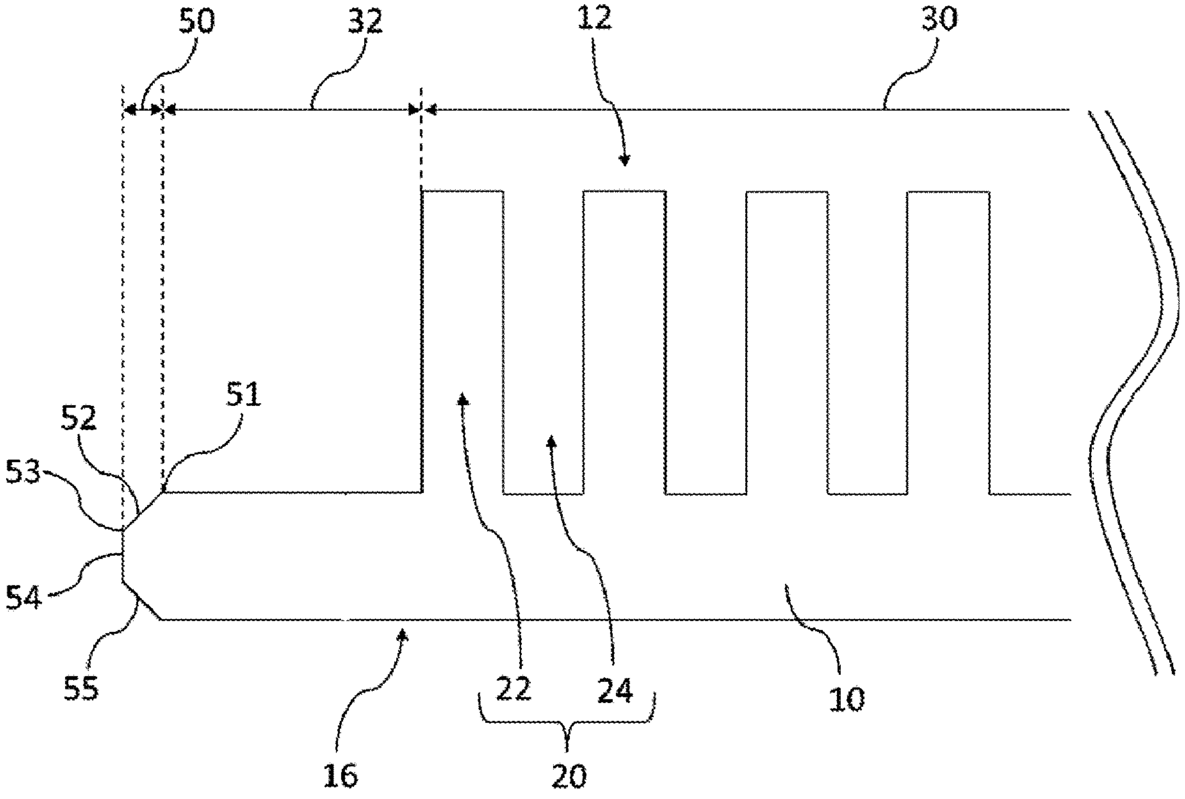
FIG. 2 is a cross-sectional view schematically showing a configuration of a semiconductor substrate.
Figure 3A:
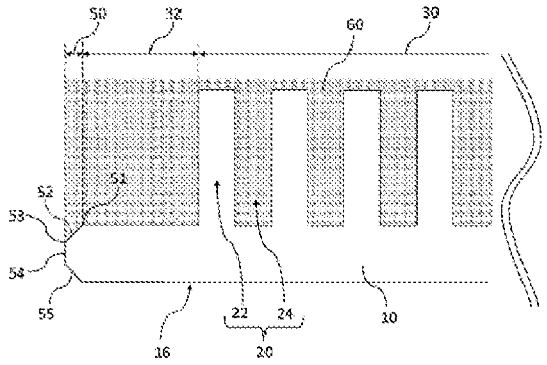
FIGS. 3A to 3C are process cross-sectional views schematically showing a manufacturing process of the semiconductor substrate.
Figure 3B:
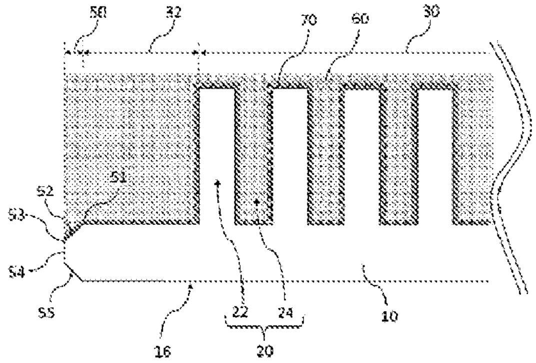
Figure 3C:
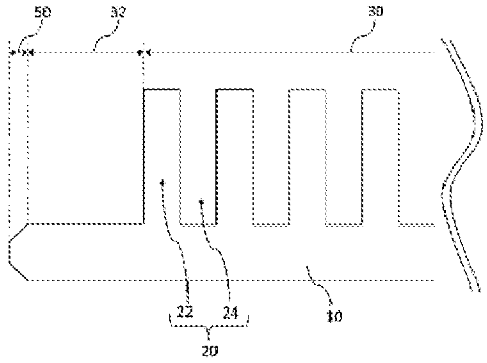

FIG. 2 is a cross-sectional view showing an example of the concave-convex structure 20.

In the present embodiment, a pattern dimension of the concave-convex structure 20 is defined as at least one dimension in a width direction of an in-plane direction of the main surface 12 and/or at least one dimension in a height direction of a direction perpendicular to the main surface 12.

At least one or more pattern dimensions of the width and the height in the cross-sectional structure (in a thickness direction of the substrate) of the pattern of the concave-convex structure 20, or at least one or more pattern dimensions of the width (length in an X-axis direction), the height (length in a Y-axis direction), and the depth (length in a Z-axis direction) in the three-dimensional structure (three-dimensional coordinates of XYZ) in the pattern of the concave-convex structure 20 may be, for example, 30 nm or less, 20 nm or less, or 10 nm or less. These may be a spacing between the patterns. Even in a case where the substrate 10 having such a fine concave-convex structure 20 used, the surface treatment agent composition according to the present embodiment can be applied.

Such a surface treatment agent composition is suitable, for example, for a surface treatment of the substrate 10 having the concave-convex structure 20 having a pattern dimension of 30 nm or less, preferably 20 nm or less.

An aspect ratio of a convex portion 22 may be, for example, 3 or more, 5 or more, or 10 or more. Even in the concave-convex structure 20 which has the convex portion 22 having a fragile structure, the pattern collapse can be suppressed.

On the other hand, the aspect ratio of the convex portion 22 is not particularly limited, but may be 100 or less.

The aspect ratio of the convex portion 22 is represented by a value obtained dividing the height of the convex portion 22 by the width of the convex portion 22.

As shown in FIGS. 1 and 2, the substrate 10 may have a bevel region 50 formed in at least apart of the edge portion of the substrate 10. It is sufficient that the substrate 10 in the bevel region 50 include an inclined surface (bevel) formed on the main surface 12, and for example, the substrate 10 include a top edge 51, an upper bevel 52, a front shoulder 53, an end face 54, and a lower bevel 55.

Subsequently, the main surface 12 of the substrate 10 may be brought into contact with an aqueous cleaning solution as necessary (cleaning step).

Examples of the aqueous cleaning solution include water, alcohol, an ammonium hydroxide aqueous solution, a tetramethylammonium aqueous solution, a hydrochloric acid aqueous solution, a hydrogen peroxide aqueous solution, a sulfuric acid aqueous solution, and an organic solvent. These may be used alone or in combination of two or more kinds thereof.

The cleaning step may be performed once or twice or more before the surface treatment step or before a first rinsing step. Other steps may be included between a plurality of cleaning steps or between the cleaning step and the surface treatment step.

Subsequently, the main surface 12 of the substrate 10 may be brought into contact with a first rinsing solution as necessary (first rinsing step). As the first rinsing solution, a cleaning solution different from the aqueous cleaning solution can be used, and examples thereof include water, an organic solvent, a mixture thereof, and a solution thereof mixed with at least one of an acid, an alkali, a surfactant, and an oxidizing agent.

Examples of the organic solvent used in the first rinsing solution include hydrocarbons, esters, ethers, ketones, halogen element-containing solvents, sulfoxide-based solvents, alcohols, derivatives of polyhydric alcohol, and nitrogen element-containing solvents. Among these, as the organic solvent, it is preferable to use at least one selected from an alcohol having 3 or less carbon atoms, such as methanol, 1-propanol, and 2-propanol (isopropanol).

In addition, a plurality of types may be used as the first rinsing solution. For example, the rinsing can be performed in the order of a solution including an acid aqueous solution or an alkali aqueous solution an organic solvent. In addition, the rinsing may be performed by adding the aqueous cleaning solution so as to be in the order of a solution including an acid aqueous solution or an alkali aqueous solution the aqueous cleaning solution an organic solvent.

The first rinsing step may be performed once or twice or more after the cleaning step or before the surface treatment step. Other steps may be included between a plurality of first rinsing steps or between the first rinsing step and the surface treatment step.

Subsequently, as shown in FIG. 3A, the surface treatment agent composition 60 according to the present embodiment is brought into contact with the main surface 12 of the substrate 10 (surface treatment agent composition).

It is preferable to supply the liquid surface treatment agent composition 60 to the concave-convex structure 20 formed on the surface of the substrate 10. In this case, the liquid surface treatment agent composition 60 may be supplied so as to fill a part or all of a concave portion 24 of the concave-convex structure 20.

The surface treatment agent composition 60 may be supplied in a state in which the first rinsing solution or the aqueous cleaning solution is held on the main surface 12. That is, by replacing the first rinsing solution or the aqueous cleaning solution with the surface treatment agent composition 60, the surface treatment step can be performed before the surface of the concave-convex structure on the main surface 12 of the substrate 10 is dried.

As a method of supplying the surface treatment agent composition 60, a known method can be used, and for example, a single wafer method typified by a spin method (spin coating method) in which a composition is supplied near a center of rotation while wafers are held one by one substantially horizontally and rotated to replace a cleaning solution or the like held in a concave-convex pattern of the wafer, so that the composition is filled, is preferable, and a batch method or the like in which a plurality of wafers are immersed in a composition tank to replace the cleaning solution or the like held in the concave-convex pattern of the wafers, so that the composition is filled, may be used.

Subsequently, as shown in FIG. 3B, a surface treatment agent layer 70 can be formed on the main surface 12 of the substrate 10 by bringing the surface treatment agent composition 60 into contact with the main surface 12.

As necessary, known methods such as heating treatment, decompression treatment, and drying treatment may be applied to the surface treatment agent composition 60 on the main surface 12 to promote the formation of the surface treatment agent layer 70.

The surface treatment agent layer 70 is formed on at least in the pattern formation region 30 and the pattern non-formation region 32 on the main surface 12 of the substrate 10. The surface treatment agent layer 70 may be formed on the main surface 12 in the bevel region 50, or may be formed on the entire main surface 12.

Subsequently, the main surface 12 on which the surface treatment agent layer 70 may be brought into contact with a second rinsing solution as necessary (second rinsing step).

As the second rinsing solution, those mentioned for the first rinsing solution can be used.

In addition, a plurality of types may be used as the second rinsing solution. For example, the rinsing can be performed in the order of water→an organic solvent such as isopropanol or in the order of an organic solvent such as isopropanol→water.

The second rinsing step may be performed once or twice or more after the surface treatment step. Other steps may be included between a plurality of second rinsing steps or between the second rinsing step and the surface treatment step.

Subsequently, a drying step of drying the main surface 12 of the substrate 10 may be performed as necessary.

By the drying step, the liquid existing on the main surface 12 of the substrate 10 can be removed.

As a drying method, for example, known methods such as a spin drying method, an IPA (2-propanol) steam drying, a Marangoni drying, a heat drying, a warm air drying, and a vacuum drying may be used.

The drying step may be performed once or twice or more, and for example, may be performed after the surface treatment step or after the second rinsing step. The drying step and the second rinsing step may be repeated alternately.

Subsequently, as shown in FIG. 3C, the surface treatment agent layer 70 on the main surface 12 of the substrate 10 may be removed (removal step).

Examples of a removing method include heating, UV irradiation, ozone exposure, plasma irradiation, and corona discharge. In addition, a treatment with a concentrated fluid such as a supercritical fluid (which may include an acid, a base, or an oxidizing agent) or a steam treatment may be performed. These may be used alone or in combination of two or more kinds thereof. These treatments may be performed under atmospheric pressure or reduced pressure.

As a result, a semiconductor substrate (substrate 10) using the surface treatment agent composition according to the present embodiment can be obtained.

The manufacturing method shown in FIGS. 3A to 3C targets a wafer pattern, but the present invention is not limited thereto. In the method for manufacturing a substrate according to the present embodiment, it is also possible to suppress a resist pattern from collapsing by using the surface treatment agent composition according to the embodiment of the present invention in the cleaning and drying step of the resist pattern.

Although the above-described supply step has been described as a manufacturing method performed after the cleaning step, the present invention is not limited thereto, and the supply step may be performed after various treatments performed on the concave-convex structure 20.

As the method for manufacturing a substrate, one or a combination of two or more known treatments may be used in addition to the above-described steps. For example, after the above-described removal step, a surface treatment such as a plasma treatment may be performed.

Next, the surface treatment agent composition used for the above-described surface treatment of the semiconductor substrate will be described.

The surface treatment agent composition according to the present embodiment includes a silylating agent.

As the above-described silylating agent, a known silylating agent can be used. As the silylating agent, for example, a silicon compound represented by General Formula [1] is used. These may be used alone or in combination of two or more kinds thereof.

$$R^1_aSi(H)_bX_{4-a-b} \quad [1]$$

In General Formula [1], $R^1$'s each independently represent an organic group including a hydrocarbon group having 1 to 18 carbon atoms, in which a part or all of hydrogen elements may be replaced with fluorine elements, X's each independently represent a monovalent organic group in which an element bonded to an Si element is nitrogen, oxygen, carbon, or halogen, a represents an integer of 1 to 3, b represents an integer of 0 to 2, and a sum of a and b is 1 to 3.

$R^1$ in General Formula [1] may include not only hydrogen, carbon, nitrogen, oxygen, and fluorine elements, but also a silicon element, a sulfur element, a halogen element (other than fluorine), and the like.

In addition, $R^1$ in General Formula [1] may include an unsaturated bond, an aromatic ring, or a cyclic structure.

Examples of $R^1$ in General Formula [1] each independently include at least one group selected from $C_eH_{2e+1}$ (e=1 to 18) and $C_fF_{2f+1}CH_2CH_2$ (f=1 to 8). Among these, a silicon compound having a trialkylsilyl group can be used.

In a case where $R^1$ in General Formula [1] includes a silicon element, a structure of General Formula [1-1] below may be adopted.

$$R^1_mX_{3-m-n}(H)_nSi—(CH_2)_p—Si(H)_nX_{3-m-n}R^1_m \quad [1\text{-}1]$$

In General Formula [1-1], $R^1$'s (however, a silicon element is not included in $R^1$'s) and X are the same as in General Formula [1], m represents an integer of 1 or 2, n represents an integer of 0 or 1, the sum of m and n is 1 or 2, p represents an integer of 1 to 18, and a methylene chain represented by $—(CH_2)_p—$ may be substituted with halogen.

In X in General Formula [1], the monovalent organic group in which the element bonded to the Si element is nitrogen, oxygen, or carbon includes not only hydrogen, carbon, nitrogen, and oxygen elements, but also a silicon element, a sulfur element, a halogen element, and the like.

Examples of the above-described monovalent organic group in which the element bonded to the Si element is nitrogen include an isocyanate group, an amino group, a dialkylamino group, an isothiocyanate group, an azido group, an acetamide group, $—NHC(═O)CF_3$, $—N(CH_3)C(═O)CH_3$, $—N(CH_3)C(═O)CF_3$, $—N═C(CH_3)OSi(CH_3)_3$, $—N═C(CF_3)OSi(CH_3)_3$, $—NHC(═O)—OSi(CH_3)_3$, $—NHC(═O)—NH—Si(CH_3)_3$, an imidazole ring, a triazole ring, a tetrazole ring, an oxazolidinone ring, a morpholine ring, $—NH—C(═O)—Si(CH_3)_3$, $—N(S(═O)_2R^4)_2$ (here, $R^4$'s each independently represent a group selected from the group consisting of a monovalent hydrocarbon group having 1 to 8 carbon atoms, in which a part or all of hydrogen elements may be replaced with fluorine elements, and a fluorine element), a substituent having a structure of General Formula [1-2]

[1-2]

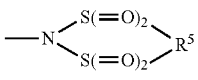

(in General Formula [1-2], $R^5$'s each independently represent a divalent hydrocarbon group having 1 to 8 carbon atoms, in which a part or all of hydrogen elements may be replaced with fluorine elements), $—N═C(NR^6_2)_2$, $—N═C(NR^6_2)R^6$ (here, $R^6$'s are each independently selected from a hydrogen group, a —C≡N group, a $—NO_2$ group, and a hydrocarbon group in which a part or all of hydrogen elements may be replaced with fluorine elements; the hydrocarbon group may have an oxygen atom and/or a nitrogen atom), $—N(R^{a1})(R^{a2})$ (here, $R^{a1}$ represents a hydrogen atom or a saturated or unsaturated alkyl group, and $R^{a2}$ represents a saturated or unsaturated alkyl group, a saturated or unsaturated cycloalkyl group, or a saturated or unsaturated heterocycloalkyl group; $R^{a1}$ and $R^{a2}$ may be bonded to each other to form a saturated or unsaturated heterocycloalkyl group having a nitrogen atom), $—N(R^{a3})—Si(R^{a4})(R^{a5})(R^{a6})$ (here, $R^{a3}$ represents a hydrogen atom, a hydrocarbon group having 1 to 4 carbon atoms, a trimethylsilyl group, or a dimethylsilyl group, $R^{a4}$, $R^{a5}$, and $R^{a6}$ each independently represent a hydrogen atom or an organic group, and the total number of carbon atoms included in $R^{a4}$, $R^{a5}$, and $R^{a6}$ is 1 or more), and $—N(R^{a7})—C(═O)R^{a8}$ (here, $R^{a7}$ represents a hydrogen atom, a methyl group, a trimethylsilyl group, or a dimethylsilyl group, and $R^{a8}$ represents a hydrogen atom, a saturated or unsaturated alkyl group, a fluorine-containing alkyl group, or a trialkylsilylamino group).

Examples of a silylating agent that X in General Formula [1] is a monovalent organic group in which the element bonded to the Si element is nitrogen include $CH_3Si(NH_2)_3$, $C_2H_5Si(NH_2)_3$, $C_3H_7Si(NH_2)_3$, $C_4H_9Si(NH_2)_3$, $C_5H_{11}Si(NH_2)_3$, $C_6H_{13}Si(NH_2)_3$, $C_7H_{15}Si(NH_2)_3$, $C_8H_{17}Si(NH_2)_3$, $C_9H_{19}Si(NH_2)_3$, $C_{10}H_{21}Si(NH_2)_3$, $C_{11}H_{23}Si(NH_2)_3$, $C_{12}H_{25}Si(NH_2)_3$, $C_{13}H_{27}Si(NH_2)_3$, $C_{14}H_{29}Si(NH_2)_3$, $C_{15}H_{31}Si(NH_2)_3$, $C_{16}H_{33}Si(NH_2)_3$, $C_{17}H_{35}Si(NH_2)_3$, $C_{18}H_{37}Si(NH_2)_3$, $(CH_3)_2Si(NH_2)_2$, $C_2H_5Si(CH_3)(NH_2)_2$, $(C_2H_5)_2Si(NH_2)_2$, $C_3H_7Si(CH_3)(NH_2)_2$, $(C_3H_7)_2Si(NH_2)_2$, $C_4H_9Si(CH_3)(NH_2)_2$, $(C_4H_9)_2Si(NH_2)_2$, $C_5H_{11}Si(CH_3)(NH_2)_2$, $C_6H_{13}Si(CH_3)(NH_2)_2$, $C_7H_{15}Si(CH_3)(NH_2)_2$, $C_8H_{17}Si(CH_3)(NH_2)_2$, $C_9H_{19}Si(CH_3)(NH_2)_2$, $C_{10}H_{21}Si(CH_3)(NH_2)_2$, $C_{11}H_{23}Si(CH_3)(NH_2)_2$, $C_{12}H_{25}Si(CH_3)(NH_2)_2$, $C_{13}H_{27}Si(CH_3)(NH_2)_2$, $C_{14}H_{29}Si(CH_3)(NH_2)_2$, $C_{15}H_{31}Si(CH_3)(NH_2)_2$, $C_{16}H_{33}Si(CH_3)(NH_2)_2$, $C_{17}H_{35}Si(CH_3)(NH_2)_2$, $C_{18}H_{37}Si(CH_3)(NH_2)_2$, $(CH_3)_3SiNH_2$, $C_2H_5Si(CH_3)_2NH_2$, $(C_2H_5)_2Si(CH_3)NH_2$, $(C_2H_5)_3SiNH_2$, $C_3H_7Si(CH_3)_2NH_2$, $(C_3H_7)_2Si(CH_3)NH_2$, $(C_3H_7)_3SiNH_2$, $C_4H_9Si(CH_3)_2NH_2$, $(C_4H_9)_3SiNH_2$, $C_5H_{11}Si(CH_3)_2NH_2$, $C_6H_{13}Si(CH_3)_2NH_2$, $C_7H_{15}Si(CH_3)_2NH_2$, $C_8H_{17}Si(CH_3)_2NH_2$, $C_9H_{19}Si(CH_3)_2NH_2$, $C_{10}H_{21}Si(CH_3)_2NH_2$, $C_{11}H_{23}Si(CH_3)_2NH_2$, $C_{12}H_{25}Si(CH_3)_2NH_2$, $C_{13}H_{27}Si(CH_3)_2NH_2$, $C_{14}H_{29}Si(CH_3)_2NH_2$, $C_{15}H_{31}Si(CH_3)_2NH_2$, $C_{16}H_{33}Si(CH_3)_2NH_2$, $C_{17}H_{35}Si(CH_3)_2NH_2$, $C_{18}H_{37}Si(CH_3)_2NH_2$, $(CH_3)_2Si(H)NH_2$, $CH_3Si(H)_2NH_2$, $(C_2H_5)_2Si(H)NH_2$, $C_2H_5Si(H)_2NH_2$, $C_2H_5Si(CH_3)(H)NH_2$, $(C_3H_7)_2Si(H)NH_2$, $C_3H_7Si(H)_2NH_2$, $CF_3CH_2CH_2Si(NH_2)_3$, $C_2F_5CH_2CH_2Si(NH_2)_3$, $C_3F_7CH_2CH_2Si(NH_2)_3$, $C_4F_9CH_2CH_2Si(NH_2)_3$, $C_5F_{11}CH_2CH_2Si(NH_2)_3$, $C_6F_{13}CH_2CH_2Si(NH_2)_3$, $C_7F_{15}CH_2CH_2Si(NH_2)_3$, $C_8F_{17}CH_2CH_2Si(NH_2)_3$, $CF_3CH_2CH_2Si(CH_3)(NH_2)_2$, $C_2F_5CH_2CH_2Si(CH_3)(NH_2)_2$, $C_3F_7CH_2CH_2Si(CH_3)(NH_2)_2$, $C_4F_9CH_2CH_2Si(CH_3)(NH_2)_2$, $C_5F_{11}CH_2CH_2Si(CH_3)(NH_2)_2$, $C_6F_{13}CH_2CH_2Si(CH_3)(NH_2)_2$, $C_7F_{15}CH_2CH_2Si(CH_3)(NH_2)_2$, $C_8F_{17}CH_2CH_2Si(CH_3)(NH_2)_2$, $CF_3CH_2CH_2Si(CH_3)_2NH_2$, $C_2F_5CH_2CH_2Si(CH_3)_2NH_2$, $C_3F_7CH_2CH_2Si(CH_3)_2NH_2$, $C_4F_9CH_2CH_2Si(CH_3)_2NH_2$, $C_5F_{11}CH_2CH_2Si(CH_3)_2NH_2$, $C_6F_{13}CH_2CH_2Si(CH_3)_2NH_2$, $C_7F_{15}CH_2CH_2Si(CH_3)_2NH_2$, $C_8F_{17}CH_2CH_2Si(CH_3)_2NH_2$, $CF_3CH_2CH_2Si(CH_3)(H)NH_2$, aminosilanes such as aminodimethylvinylsilane, aminodimethylphenylethylsilane, aminodimethylphenylsilane, aminomethyldiphenylsilane, and aminodimethyl-t-butylsilane, and a group in which an amino group ($—NH_2$ group) in the aminosilane is replaced with —N═C═O, a dialkylamino group ($—N(CH_3)_2$, $—N(C_2H_5)_2$, and the like), a t-butylamino group, an allylamino group, —N═C═S, $—N_3$, $—NHC(═O)CH_3$, $—NHC(═O)CF_3$, $—N(CH_3)C(═O)CH_3$, $—N(CH_3)C(═O)CF_3$, $—N═C(CH_3)OSi(CH_3)_3$, $—N═C(CF_3)OSi(CH_3)_3$, $—NHC(═O)—OSi(CH_3)_3$, $—NHC(═O)—NH—Si(CH_3)_3$ (for example, N,N'-bis(trimethylsilyl)urea and the like), an imidazole ring (for example, N-trimethylsilylimidazole and the like), a triazole ring (for example, N-trimethylsilyltriazole), a tetrazole ring, an oxazolidinone ring, a morpholine ring, $—NH—C(=O)—Si(CH_3)_3$, $—N(S(=O)_2R^4)_2$ (here, $R^4$'s each independently represent a group selected from the group consisting of a monovalent hydrocarbon group having 1 to 8 carbon atoms, in which a part or all of hydrogen elements may be replaced with fluorine elements, and a fluorine element; for example, N-(trimethylsilyl)bis(trifluoromethanesulfonyl)imide and the like), a substituent having a structure of General Formula [1-2]

[1-2]

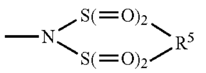

(in General Formula [1-2], $R^5$'s each independently represent a divalent hydrocarbon group having 1 to 8 carbon atoms, in which a part or all of hydrogen elements may be replaced with fluorine elements; for example, N-(trimethylsilyl) N,N-difluoromethane-1,3-bis(sulfonyl)imide and the like), $—N=C(NR^6{}_2)_2$, $—N=C(NR^6{}_2)R^6$ (here, $R^6$'s are each independently selected from a hydrogen group, a $—C≡N$ group, a $—NO_2$ group, and a hydrocarbon group in which a part or all of hydrogen elements may be replaced with fluorine elements; the hydrocarbon group may have an oxygen atom and/or a nitrogen atom; for example, 2-trimethylsilyl-1,1,3,3-tetramethylguanidine and the like), $—N(R^{a1})(R^{a2})$ (here, $R^{a1}$ represents a hydrogen atom or a saturated or unsaturated alkyl group, and $R^{a2}$ represents a saturated or unsaturated alkyl group, a saturated or unsaturated cycloalkyl group, or a saturated or unsaturated heterocycloalkyl group; $R^{a1}$ and $R^{a2}$ may be bonded to each other to form a saturated or unsaturated heterocycloalkyl group having a nitrogen atom), $—N(R^{a3})—Si(R^{a4})(R^{a5})(R^{a6})$ (here, $R^{a3}$ represents a hydrogen atom, a hydrocarbon group having 1 to 4 carbon atoms, a trimethylsilyl group, or a dimethylsilyl group, $R^{a4}$, $R^{a5}$, and $R^{a6}$ each independently represent a hydrogen atom or an organic group, and the total number of carbon atoms included in $R^{a4}$, $R^{a5}$, and $R^{a6}$ is 1 or more; for example, hexamethyldisilazane, N-methylhexamethyldisilazane, 1,1,3,3-tetramethyldisilazane, 1,3-dimethyldisilazane, 1,3-di-N-octyltetramethyldisilazane, 1,3-divinyltetramethyldisilazane, heptamethyldisilazane, N-allyl-N,N-bis(trimethylsilyl) amine, 1,3-diphenyltetramethyldisilazane, 1,1,3,3-tetraphenyl-1,3-dimethyldisilazane, nonamethyltrisilazane, pentamethylethyldisilazane, pentamethylvinyldisilazane, pentamethylpropyldisilazane, pentamethylethyldisilazane, pentamethyl-t-butyldisilazane, pentamethylphenyldisilazane, trimethyltriethyldisilazane, and the like), or $—N(R^{a7})—C(=O)R^{a8}$ (here, $R^{a7}$ represents a hydrogen atom, a methyl group, a trimethylsilyl group, or a dimethylsilyl group, and $R^{a8}$ represents a hydrogen atom, a saturated or unsaturated alkyl group, a fluorine-containing alkyl group, or a trialkylsilylamino group; for example, N-trimethylsilylacetamide, N-trimethylsilyltrifluoroacetamide, N-methyl-N-trimethylsilylacetamide, N-methyl-N-trimethylsilyltrifluoroacetamide, bis(trimethylsilyl)acetamide, bis(trimethylsilyl)trifluoroacetamide, and the like).

Examples of a silylating agent that X in General Formula [1] is a monovalent organic group in which the element bonded to the Si element is oxygen include a group in which the amino group ($—NH_2$ group) in the above-described aminosilane is replacedwith $—O—C(=A)R^{a9}$ (here, A represents O, $CHR^{a10}$, $CHOR^{a10}$, $CR^{a10}R^{a10}$, or $NR^{a11}$, $R^{a9}$ and $R^{a10}$ each independently represent a hydrogen atom, a saturated or unsaturated alkyl group, a saturated or unsaturated cycloalkyl group, a fluorine-containing alkyl group, a chlorine-containing alkyl group, a trialkylsilyl group, a trialkylsiloxy group, an alkoxy group, a phenyl group, a phenylethyl group, or an acetyl group, and $R^{a11}$ represents a hydrogen atom, an alkyl group, or a trialkylsilyl group; for example, trimethylsilyl acetate, dimethylsilylacetate, monomethylsilylacetate, trimethylsilyltrifluoroacetate, dimethylsilyltrifluoroacetate, monomethylsilyltrifluoroacetate, trimethylsilyltrichloroacetate, trimethylsilylpropionate, trimethylsilyl butyrate, and the like), $—O—C(R^{a12})=N(R^{a13})$ (here, $R^{a12}$ represents a hydrogen atom, a saturated or unsaturated alkyl group, a fluorine-containing alkyl group, or a trialkylsilylamino group, and $R^{a13}$ represents a hydrogen atom, an alkyl group, or a trialkylsilyl group), $—O—C(R^{a14})=CH—C(=O)R^{a15}$ (here, $R^{a14}$ and $R^{a15}$ each independently represent a hydrogen atom or an organic group; for example, trimethylsilyloxy-3-penten-2-one, 2-trimethylsiloxypent-2-en-4-one, and the like), $—OR^{a16}$ (here, $R^{a16}$ represents a saturated or unsaturated alkyl group, a saturated or unsaturated cycloalkyl group, or a fluorine-containing alkyl group; for example, alkylmethoxysilanes such as $CH_3Si(OCH_3)_3$, $C_2H_5Si(OCH_3)_3$, $C_3H_7Si(OCH_3)_3$, $C_4H_9Si(OCH_3)_3$, $C_5H_{11}Si(OCH_3)_3$, $C_6H_{13}Si(OCH_3)_3$, $C_7H_{15}Si(OCH_3)_3$, $C_8H_{17}Si(OCH_3)_3$, $C_9H_{19}Si(OCH_3)_3$, $C_{10}H_{21}Si(OCH_3)_3$, $C_{11}H_{23}Si(OCH_3)_3$, $C_{12}H_{25}Si(OCH_3)_3$, $C_{13}H_{27}Si(OCH_3)_3$, $C_{14}H_{29}Si(OCH_3)_3$, $C_{15}H_{31}Si(OCH_3)_3$, $C_{16}H_{33}Si(OCH_3)_3$, $C_{17}H_{35}Si(OCH_3)_3$, $C_{18}H_{37}Si(OCH_3)_3$, $(CH_3)_2Si(OCH_3)_2$, $C_2H_5Si(CH_3)(OCH_3)_2$, $(C_2H_5)_2Si(OCH_3)_2$, $C_3H_7Si(CH_3)(OCH_3)_2$, $(C_3H_7)_2Si(OCH_3)_2$, $C_4H_9Si(CH_3)(OCH_3)_2$, $(C_4H_9)_2Si(OCH_3)_2$, $C_5H_{11}Si(CH_3)(OCH_3)_2$, $C_6H_{13}Si(CH_3)(OCH_3)_2$, $C_7H_{15}Si(CH_3)(OCH_3)_2$, $C_8H_{17}Si(CH_3)(OCH_3)_2$, $C_9H_{19}Si(CH_3)(OCH_3)_2$, $C_{10}H_{21}Si(CH_3)(OCH_3)_2$, $C_{11}H_{23}Si(CH_3)(OCH_3)_2$, $C_{12}H_{25}Si(CH_3)(OCH_3)_2$, $C_{13}H_{27}Si(CH_3)(OCH_3)_2$, $C_{14}H_{29}Si(CH_3)(OCH_3)_2$, $C_{15}H_{31}Si(CH_3)(OCH_3)_2$, $C_{16}H_{33}Si(CH_3)(OCH_3)_2$, $C_{17}H_{35}Si(CH_3)(OCH_3)_2$, $C_{18}H_{37}Si(CH_3)(OCH_3)_2$, $(CH_3)_3SiOCH_3$, $C_2H_5Si(CH_3)_2OCH_3$, $(C_2H_5)_2Si(CH_3)OCH_3$, $(C_2H_5)_3SiOCH_3$, $C_3H_7Si(CH_3)_2OCH_3$, $(C_3H_7)_2Si(CH_3)OCH_3$, $(C_3H_7)_3SiOCH_3$, $C_4H_9Si(CH_3)_2OCH_3$, $(C_4H_9)_3SiOCH_3$, $C_5H_{11}Si(CH_3)_2OCH_3$, $C_6H_{13}Si(CH_3)_2OCH_3$, $C_7H_{15}Si(CH_3)_2OCH_3$, $C_8H_{17}Si(CH_3)_2OCH_3$, $C_9H_{19}Si(CH_3)_2OCH_3$, $C_{10}H_{21}Si(CH_3)_2OCH_3$, $C_{11}H_{23}Si(CH_3)_2OCH_3$, $C_{12}H_{25}Si(CH_3)_2OCH_3$, $C_{13}H_{27}Si(CH_3)_2OCH_3$, $C_{14}H_{29}Si(CH_3)_2OCH_3$, $C_{15}H_{31}Si(CH_3)_2OCH_3$, $C_{16}H_{33}Si(CH_3)_2OCH_3$, $C_{17}H_{35}Si(CH_3)_2OCH_3$, $C_{18}H_{37}Si(CH_3)_2OCH_3$, $(CH_3)_2Si(H)OCH_3$, $CH_3Si(H)_2OCH_3$, $(C_2H_5)_2Si(H)OCH_3$, $C_2H_5Si(H)_2OCH_3$, $C_2H_5Si(CH_3)(H)OCH_3$, and $(C_3H_7)_2Si(H)OCH_3$, fluoroalkylmethoxysilanes such as $CF_3CH_2CH_2Si(OCH_3)_3$, $C_2F_5CH_2CH_2Si(OCH_3)_3$, $C_3F_7CH_2CH_2Si(OCH_3)_3$, $C_4F_9CH_2CH_2Si(OCH_3)_3$, $C_5F_{11}CH_2CH_2Si(OCH_3)_3$, $C_6F_{13}CH_2CH_2Si(OCH_3)_3$, $C_7F_{15}CH_2CH_2Si(OCH_3)_3$, $C_8F_{17}CH_2CH_2Si(OCH_3)_3$, $CF_3CH_2CH_2Si(CH_3)(OCH_3)_2$, $C_2F_5CH_2CH_2Si(CH_3)(OCH_3)_2$, $C_3F_7CH_2CH_2Si(CH_3)(OCH_3)_2$, $C_4F_9CH_2CH_2Si(CH_3)(OCH_3)_2$, $C_5F_{11}CH_2CH_2Si(CH_3)(OCH_3)_2$, $C_6F_{13}CH_2CH_2Si(CH_3)(OCH_3)_2$, $C_7F_{15}CH_2CH_2Si(CH_3)(OCH_3)_2$, $C_8F_{17}CH_2CH_2Si(CH_3)(OCH_3)_2$, $CF_3CH_2CH_2Si(CH_3)_2OCH_3$, $C_2F_5CH_2CH_2Si(CH_3)_2OCH_3$, $C_3F_7CH_2CH_2Si(CH_3)_2OCH_3$, $C_4F_9CH_2CH_2Si(CH_3)_2OCH_3$, $C_5F_{11}CH_2CH_2Si(CH_3)_2OCH_3$, $C_6F_{13}CH_2CH_2Si(CH_3)_2OCH_3$, $C_7F_{15}CH_2CH_2Si(CH_3)_2OCH_3$, $C_8F_{17}CH_2CH_2Si(CH_3)_2OCH_3$, and $CF_3CH_2CH_2Si(CH_3)(H)OCH_3$, a compound in which the methyl group portion of the methoxy group of methoxysilane is replaced with a monovalent hydrocarbon group having 2 to 18 carbon atoms, in which a part or all of hydrogen elements may be replaced with fluorine elements, and the like), —O—S(=O)$_2$—$R^{a17}$ (here, $R^{a17}$ represents an alkyl group having 1 to 6 carbon atoms, a perfluoroalkyl group, a phenyl group, a tolyl group, or a —O—$Si(CH_3)_3$ group; for example, trimethylsilylsulfonate, trimethylsilylbenzenesulfonate, trimethylsilyltoluenesulfonate, trimethylsilyltrifluoromethanesulfonate, trimethylsilylperfluorobutanesulfonate, bistrimethylsilylsulfate, and the like), or —O—P(—O—$Si(CH_3)_3)_2$ (for example, tristrimethylsilylphosphite).

In addition, examples of the silylating agent that X in General Formula [1] is a monovalent organic group in which the element bonded to the Si element is oxygen also include siloxane compounds such as hexamethyldisiloxane, 1,3-diphenyl-1,3-dimethyldisiloxane, 1,1,3,3-tetramethyldisiloxane, 1,1,1-triethyl-3,3-dimethyldisiloxane, 1,1,3,3-tetra-n-octyldimethyldisiloxane, bis(nonafluorohexyl) tetramethyldisiloxane, 1,3-bis(trifluoropropyl) tetramethyldisiloxane, 1,3-di-n-butyltetramethyldisiloxane, 1,3-di-n-octyltetramethyldisiloxane, 1,3-diethyltetramethyldisiloxane, 1,3-diphenyltetramethyldisiloxane, hexa-n-butyldisiloxane, hexaethyldisiloxane, hexavinyldisiloxane, 1,1,3,3-tetraisopropyldisiloxane, vinylpentamethyldisiloxane, 1,3-bis(3-chloroisobutyl)tetramethyldisiloxane, hexaphenyldisiloxane, 1,1,1-triethyl-3,3,3-trimethyldisiloxane, 1,3-bis(chloromethyl)tetramethyldisiloxane, 1,1,3,3-tetraphenyldimethyldisiloxane, pentamethyldisiloxane, 1,3-bis (3-chloropropyl) tetramethyldisiloxane, 1,3-dichloro-1,3-diphenyl-1,3-dimethyldisiloxane, n-butyl-1,1,3,3-tetramethyldisiloxane, 1,3-di-t-butyldisiloxane, vinyl-1,1,3,3-tetramethyldisiloxane, 1,1,1-trimethyl-3,3,3-triphenyldisiloxane, 3,3-diphenyltetramethyltrisiloxane, 3-phenylheptamethyltrisiloxane, hexamethylcyclotrisiloxane, n-propylheptamethyltrisiloxane, 3-ethylheptamethyltrisiloxane, 3-(3,3,3-trifluoropropyl)heptamethyltrisiloxane, 1,1,3,5,5-pentaphenyl-1,3,5-trimethyltrisiloxane, octamethyltrisiloxane, 1,1,5,5-tetraphenyl-1,3,3,5-tetramethyltrisiloxane, hexaphenylcyclotrisiloxane, 1,1,1,5,5,5-hexamethyltrisiloxane, 3-phenyl-1,1,3,5,5-pentamethyltrisiloxane, 1,3,5-trivinyl-1,1,3,5,5-pentamethyltrisiloxane, 1,3,5-trivinyl-1,3,5-trimethylcyclotrisiloxane, 3-octylheptamethyltrisiloxane, 1,3,5-triphenyltrimethylcyclotrisiloxane, 1,1,1,3,3,5,5-heptamethyltrisiloxane, 1,1,3,3,5,5-hexamethyltrisiloxane, 1,1,1,5,5,5-hexaethyl-3-methyltrisiloxane, furfuryloxytrisiloxane, tetrakis(dimethylsiloxy) silane, 1,1,3,3,5,5,7,7-octamethyltetrasiloxane, diphenylsiloxane-dimethylsiloxane copolymer, 1,3-diphenyl-1,3-dimethyldisiloxane, octamethylcyclotetrasiloxane, 1,3-bis(trimethylsiloxy)-1,3-dimethyldisiloxane, tetra-n-propyltetramethylcyclotetrasiloxane, octaethylcyclotetrasiloxane, decamethyltetrasiloxane, dodecamethylcyclohexasiloxane, dodecamethylpentasiloxane, tetradecamethylhexasiloxane, hexaphenylcyclotrisiloxane, polydimethylsiloxane, polyoctadecylmethylsiloxane, decamethylcyclopentasiloxane, poly(3,3,3-trifluoropropylmethylsiloxane), polydimethylsiloxane terminalized with trimethylsiloxy, and 1,1,3,3,5,5,7,7,9,9-decamethylpentasiloxane.

Examples of a silylating agent that X in General Formula [1] is a monovalent organic group in which the element bonded to the Si element is carbon include a group in which the amino group (—$NH_2$ group) in the above-described aminosilane is replaced with —C(S(=O)$_2R^7)_3$ (here, $R^7$'s each independently represent a group selected from the group consisting of a monovalent hydrocarbon group having 1 to 8 carbon atoms, in which a part or all of hydrogen elements may be replaced with fluorine elements, and a fluorine element; for example, (trimethylsilyl)tris(trifluoromethanesulfonyl)methide and the like).

In addition, examples of a silylating agent that X in General Formula [1] is a monovalent organic group in which the element bonded to the Si element is halogen include a group in which the amino group (—$NH_2$ group) in the above-described aminosilane is replaced with a chloro group, a bromo group, or an iodo group (for example, chlorotrimethylsilane, bromotrimethylsilane, and the like).

As the above-described silylating agent, a cyclic silazane compound can be included.

Examples of the above-described cyclic silazane compound include cyclic disilazane compounds such as 2,2,5,5-tetramethyl-2,5-disila-1-azacyclopentane and 2,2,6,6-tetramethyl-2,6-disila-1-azacyclohexane; cyclic trisilazane compounds such as 2,2,4,4,6,6-hexamethylcyclotrisilazane and 2,4,6-trimethyl-2,4,6-trivinylcyclotrisilazane; and cyclic tetrasilazane compounds such as 2,2,4,4,6,6,8,8-octamethylcyclotetrasilazane.

In addition to the above-described silylating agent, the above-described surface treatment agent composition can include, as a catalyst of the silylating agent, one or more kinds selected from the group consisting of a compound A described later, an acid imidized product, a nitrogen-containing compound, a nitrogen-containing heterocyclic compound not including a silicon atom, and a silylated heterocyclic compound. Here, the catalyst promotes the reaction between the above-described main surface and the silylating agent or enhances liquid-repellent performance of the surface treatment agent layer to be formed, and the catalyst itself or a modified product may form a part of the surface treatment agent layer.

A concentration of the above-described catalyst may be, for example, 0.005% by mass or more and 20% by mass or less or 0.05% by mass or more and 15% by mass or less with respect to 100% by mass of the above-described surface treatment agent composition.

Specific examples of the above-described compound A include trimethylsilyltrifluoroacetate, trimethylsilyltrifluoromethanesulfonate, dimethylsilyltrifluoroacetate, dimethylsilyltrifluoromethanesulfonate, butyldimethylsilyltrifluoroacetate, butyldimethylsilyltrifluoromethanesulfonate, hexyldimethylsilyltrifluoroacetate, hexyldimethylsilyltrifluoromethanesulfonate, octyldimethylsilyltrifluoroacetate, octyldimethylsilyltrifluoromethanesulfonate, decyldimethylsilyltrifluoroacetate, and decyldimethylsilyltrifluoromethanesulfonate, and one or more kinds selected from these compounds can be included. These may be used alone or in combination of two or more kinds thereof.

The above-described compound A may correspond to the above-described silylating agent, but in a case of being used as a catalyst, it means that the compound A is used in combination with other silylating agents other than the compound A.

The above-described compound A may be a compound obtained by reacting a silicon compound represented by General Formula [2] with one or more acetic acids or sulfonic acids selected from the group consisting of trifluoroacetic acid, trifluoroacetic acid anhydride, trifluoromethanesulfonic acid, and trifluoromethanesulfonic acid anhydride.

A surplus silicon compound represented by General Formula [2], which remains without being consumed in this reaction, can be used as the above-described silylating agent together with the compound A obtained in the reaction. The silicon compound represented by General Formula [2] may be reacted with the above-described acetic acids or sulfonic acids at a molar ratio of, for example, 0.2 to 100000 molar times, preferably 0.5 to 50000 molar times and more preferably 1 to 10000 molar times.

$$R^2_c(H)_dSi—X \quad [2]$$

In General Formula [2], examples of $R^2_c(H)_dSi—$ include $(CH_3)_3Si—$, $(CH_3)_2(H)Si—$, $(C_4H_9)(CH_3)_2Si—$, $(C_6H_{13})(CH_3)_2Si—$, $(C_8H_{17})(CH_3)_2Si—$, and $(C_{10}H_{21})(CH_3)_2Si—$. In addition, X is the same as in General Formula [1] described above.

In addition, the above-described compound A may be at least one kind selected from the group consisting of a sulfonic acid represented by General Formula [3], an anhydride of the sulfonic acid, a salt of the sulfonic acid, and a sulfonic acid derivative represented by General Formula [4].

$$R^8—S(=O)_2OH \quad [3]$$

[in General Formula [3], $R^8$ represents a group selected from the group consisting of a monovalent hydrocarbon group having 1 to 8 carbon atoms, in which a part or all of hydrogen elements may be replaced with fluorine elements, and a hydroxyl group]

$$R^{8'}—S(=O)_2O—Si(H)_{3-r}(R^9)_r \quad [4]$$

[in General Formula [4], $R^{8'}$ represents a monovalent hydrocarbon group having 1 to 8 carbon atoms, in which a part or all of hydrogen elements may be replaced with fluorine elements, $R^9$'s each independently represent at least one group selected from monovalent hydrocarbon groups having 1 to 18 carbon atoms, in which a part or all of hydrogen elements may be replaced with fluorine elements, and r represents an integer of 1 to 3]

In addition, the above-described compound A may be at least one kind selected from the group consisting of a sulfonate represented by General Formula [5], sulfonimides represented by General Formulae [6] and [7], sulfonimide derivatives represented by General Formulae [8] and [9], a sulfonmethide represented by General Formula [10], and a sulfonmethide derivative represented by General Formula [11].

$$R^{10}—S(=O)_2OR^{11} \quad [5]$$

[in General Formula [5], $R^{10}$ represents a group selected from the group consisting of a monovalent hydrocarbon group having 1 to 8 carbon atoms, in which a part or all of hydrogen elements may be replaced with fluorine elements, and a fluorine element, and $R^{11}$ represents a monovalent alkyl group having 1 to 18 carbon atoms]

$$(R^{12}—S(=O)_2)_2NH \quad [6]$$

[in General Formula [6], $R^{12}$'s each independently represent a group selected from the group consisting of a monovalent hydrocarbon group having 1 to 8 carbon atoms, in which a part or all of hydrogen elements may be replaced with fluorine elements, and a fluorine element]

[7]

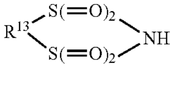

[in General Formula [7], $R^{13}$ represents a divalent hydrocarbon group having 1 to 8 carbon atoms, in which a part or all of hydrogen elements may be replaced with fluorine elements]

$$((R^{14}—S(=O)_2)_2N)_sSi(H)_t(R^{15})_{4-s-t} \quad [8]$$

[in General Formula [8], $R^{14}$'s each independently represent a group selected from the group consisting of a monovalent hydrocarbon group having 1 to 8 carbon atoms, in which a part or all of hydrogen elements may be replaced with fluorine elements, and a fluorine element, $R^{15}$'s each independently represent a monovalent hydrocarbon group having 1 to 18 carbon atoms, in which a part or all of hydrogen elements may be replaced with fluorine elements, s represents an integer of 1 to 3, t represents an integer of 0 to 2, and a sum of s and t is 3 or less]

[9]

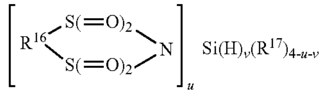

[in General Formula [9], $R^{16}$'s each independently represent a divalent hydrocarbon group having 1 to 8 carbon atoms, in which a part or all of hydrogen elements may be replaced with fluorine elements, $R^{17}$'s each independently represent a monovalent hydrocarbon group having 1 to 18 carbon atoms, in which apart or all of hydrogen elements may be replaced with fluorine elements, u represents an integer of 1 to 3, v represents an integer of 0 to 2, and a sum of u and v is 3 or less]

$$(R^{18}—S(=O)_2)_3CH \quad [10]$$

[in General Formula [10], $R^{18}$'s each independently represent a group selected from the group consisting of a monovalent hydrocarbon group having 1 to 8 carbon atoms, in which a part or all of hydrogen elements may be replaced with fluorine elements, and a fluorine element]

$$((R^{19}—S(=O)_2)_3C)_wSi(H)_x(R^{20})_{4-w-x} \quad [11]$$

[in General Formula [11], $R^{19}$'s each independently represent a group selected from the group consisting of a monovalent hydrocarbon group having 1 to 8 carbon atoms, in which a part or all of hydrogen elements may be replaced with fluorine elements, and a fluorine element, $R^{20}$'s each independently represent a monovalent hydrocarbon group having 1 to 18 carbon atoms, in which a part or all of hydrogen elements may be replaced with fluorine elements, w represents an integer of 1 to 3, x represents an integer of 0 to 2, and a sum of w and x is 3 or less].

In addition, examples of the above-described acid imidized product include compounds having a chemical structure in which an acid such as a carboxylic acid and a phosphoric acid is imidized.

In addition, examples of the above-described nitrogen-containing compound include at least one kind of compounds represented by General Formulae [12] and [13].

$$R^{21}—N=C(NR^{22}_2)_2 \quad [12]$$

$$R^{21}—N=C(NR^{22}_2)R^{22} \quad [13]$$

[in General Formulae [12] and [13], $R^{21}$ is selected from a hydrogen group, a —C≡N group, a —$NO_2$ group, an alkylsilyl group, and a hydrocarbon group in which a part or all of hydrogen elements may be replaced with fluorine elements, where the hydrocarbon group may have an oxygen atom and/or a nitrogen atom, but in a case of including a nitrogen atom, the hydrocarbon group has an acyclic structure; $R^{22}$'s are each independently selected from a hydrogen group, a —C≡N group, a —$NO_2$ group, and a hydrocarbon group in which a part or all of hydrogen elements may be replaced with fluorine elements, where the hydrocarbon group may have an oxygen atom and/or a nitrogen atom, but in a case of including a nitrogen atom, the hydrocarbon group has an acyclic structure]

In addition, examples of the above-described nitrogen-containing compound include guanidine, 1,1,3,3-tetramethylguanidine, 2-tert-butyl-1,1,3,3-tetramethylguanidine, 1,3-diphenylguanidine, 1,2,3-triphenylguanidine, N,N'-diphenylformamidine, and 2,2,3,3,3-pentafluoropropylamidine.

In addition, examples of the nitrogen-containing heterocyclic compound not including a silicon atom and the silylated heterocyclic compound include at least one kind of compounds represented by General Formulae [14] and [15].

[14]

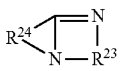

[in General Formula [14], $R^{23}$ and $R^{24}$ each independently represent a divalent organic group composed of a carbon element and/or a nitrogen element, and a hydrogen element, the total number of carbon elements and nitrogen elements is 1 to 9, and in a case of 2 or more, a carbon element which does not form a ring may be present]

[15]

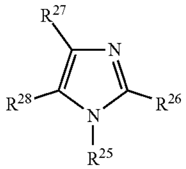

[in General Formula [15], $R^{25}$ represents an alkyl group having 1 to 6 carbon atoms, in which a part or all of hydrogen elements may be replaced with fluorine elements, a trialkylsilyl group having an alkyl group having 1 to 8 carbon atoms, in which a part or all of hydrogen elements may be replaced with fluorine elements, an alkenyl group having 2 to 6 carbon atoms, in which a part or all of hydrogen elements may be replaced with fluorine elements, an alkoxy group having 1 to 6 carbon atoms, in which a part or all of hydrogen elements may be replaced with fluorine elements, an amino group, an alkylamino group having an alkyl group having 1 to 6 carbon atoms, in which a part or all of hydrogen elements may be replaced with fluorine elements, a dialkylamino group having an alkyl group having 1 to 6 carbon atoms, in which a part or all of hydrogen elements may be replaced with fluorine elements, an aminoalkyl group having 1 to 6 carbon atoms, in which a part or all of hydrogen elements may be replaced with fluorine elements, a nitro group, a cyano group, a phenyl group, a benzyl group, or a halogen group, and $R^{26}$, $R^{27}$, and $R^{28}$ each independently represent an alkyl group having 1 to 6 carbon atoms, in which a part or all of hydrogen elements may be replaced with fluorine elements, or a hydrogen group]

In addition, the above-described nitrogen-containing heterocyclic compound not including a silicon atom may include, in the ring, a heteroatom other than the nitrogen atom, such as an oxygen atom and a sulfur atom, may have aromaticity, or may be a compound in which two or more rings are single-bonded or are bonded through a polyvalent linking group of di- or higher valent. In addition, the above-described nitrogen-containing heterocyclic compound not including a silicon atom may have a substituent.

Examples of the above-described nitrogen-containing heterocyclic compound not including a silicon atom include pyridine, pyridazine, pyrazine, pyrimidine, triazine, tetrazine, pyrrole, pyrazole, imidazole, triazole, tetrazole, oxazole, isoxazole, thiazole, isothiazole, oxadiazole, thiadiazole, quinoline, isoquinolin, cinnoline, phthalazine, quinoxalin, quinazoline, indole, indazole, benzoimidazole, benzotriazole, benzoxazole, benzoisoxazole, benzothiazole, benzoisothiazole, benzoxadiazole, benzothiadiazole, saccharin, pyrrolidine, and piperidine.

In addition, examples of the above-described silylated heterocyclic compound include a silylated imidazole compound and a silylated triazole compound. Examples of the silylated heterocyclic compound include monomethylsilylimidazole, dimethylsilylimidazole, trimethylsilylimidazole, monomethylsilyltriazole, dimethylsilyltriazole, and trimethylsilyltriazole.

The above-described silylated heterocyclic compound may correspond to the above-described silylating agent, but in a case of being used as a catalyst, it means that the silylated heterocyclic compound is used in combination with other silylating agents other than the silylated heterocyclic compound.

In the above-described surface treatment agent composition, a concentration of the above-described silylating agent or the total concentration of the above-described silylating agent and the above-described catalyst may be, for example, 0.01% by mass to 100% by mass, preferably 0.1% by mass to 50% by mass and more preferably 0.5% by mass to 30% by mass with respect to 100% by mass of the above-described surface treatment agent composition.

The surface treatment agent composition can include a solvent.

The above-described solvent is not particularly limited as long as it dissolves the above-described silylating agent. As the solvent, for example, organic solvents such as hydrocarbons, esters, ethers, ketones, halogen element-containing solvents, sulfoxide-based solvents, alcohols, carbonate-based solvents, derivatives of polyhydric alcohol, nitrogen element-containing solvents, silicone solvents, and thiols are used. Among these, hydrocarbons, esters, ethers, halogen element-containing solvents, sulfoxide-based solvents, or derivatives of polyhydric alcohol, which do not have an OH group, are preferable.

These may be used alone or in combination of two or more kinds thereof.

Examples of the above-described hydrocarbons include linear, branched, or cyclic hydrocarbon-based solvents, aromatic hydrocarbon-based solvents, and terpene-based solvents, and specific examples thereof include n-hexane, n-heptane, n-octane, n-nonane, n-decane, n-undecane, n-dodecane, n-tetradecane, n-hexadecane, n-octadecane, n-icosane, branched hydrocarbon corresponding to the carbon numbers thereof (for example, isododecane, isocetane, and the like), cyclohexane, methylcyclohexane, decalin, benzene, toluene, xylene, (ortho-, meta-, or para-)diethylbenzene, 1,3,5-trimethylbenzene, naphthalene, mesitylene, p-menthane, o-menthane, m-menthane, diphenylmenthane, limonene, α-terpinene, β-terpinene, γ-terpinene, bornane, norbornane, pinane, α-pinene, β-pinene, carane, longifolene, abietane, and a terpene-based solvent.

Examples of the above-described esters include ethyl acetate, n-propyl acetate, i-propyl acetate, n-butyl acetate, i-butyl acetate, n-pentyl acetate, i-pentyl acetate, n-hexyl acetate, n-heptyl acetate, n-octyl acetate, n-pentyl formate, n-butyl propionate, ethyl butyrate, n-propyl butyrate, i-propyl butyrate, n-butyl butyrate, methyl n-octanate, methyl decanoate, methyl pyruvate, ethyl pyruvate, n-propyl pyruvate, methyl acetoacetate, ethyl acetoacetate, ethyl 2-oxobutanoate, dimethyl adipate, methyl 3-methoxypropionate, ethyl 3-methoxypropionate, methyl 3-ethoxypropionate, ethyl 3-ethoxypropionate, and ethyl ethoxyacetate.

In addition, as the above-described esters, cyclic esters such as a lactone compound may be used. Examples of the lactone compound include β-propiolactone, γ-butyrolactone, γ-valerolactone, γ-hexanolactone, γ-heptanolactone, γ-octanolactone, γ-nonanolactone, γ-decanolactone, γ-undecanolactone, γ-dodecanolactone, δ-valerolactone, δ-hexanolactone, δ-octanolactone, δ-nonanolactone, δ-decanolactone, δ-undecanolactone, δ-dodecanolactone, and ε-hexanolactone.

Examples of the above-described ethers include di-n-propyl ether, ethyl-n-butyl ether, di-n-butyl ether, ethyl-n-amyl ether, di-n-amyl ether, ethyl-n-hexyl ether, di-n-hexyl ether, di-n-octyl ether, diisopropyl ethers corresponding to the carbon numbers thereof, ethers with branched hydrocarbon groups, such as diisopropyl ether and diisoamyl ether, dimethyl ether, diethyl ether, methyl ethyl ether, methyl cyclopentyl ether, diphenyl ether, tetrahydrofuran, and dioxane.

Examples of the above-described ketones include acetone, acetylacetone, methyl ethyl ketone, methyl propyl ketone, methyl butyl ketone, 2-heptanone, 3-heptanone, cyclohexanenone, and isophorone.

Examples of the above-described halogen element-containing solvent include perfluorocarbons such as perfluorooctane, perfluorononane, perfluorocyclopentane, perfluorocyclohexane, and hexafluorobenzene; hydrofluorocarbons such as 1,1,1,3,3-pentafluorobutane, octafluorocyclopentane, 2,3-dihydrodecafluoropentane, and ZEORORA H (manufactured by ZEON CORPORATION); hydrofluoroethers such as methyl perfluoropropyl ether, methyl perfluoroisobutyl ether, methyl perfluorobutyl ether, ethyl perfluorobutyl ether, ethyl perfluoroisobutyl ether, methyl perfluorohexyl ether, ethyl perfluorohexyl ether, Asahiklin AE-3000 (manufactured by Asahi Glass Co., Ltd.), Novec HFE-7100, Novec HFE-7200, Novec 7300, and Novec 7600 (all manufactured by 3M); chlorocarbons such as tetrachloromethane; hydrochlorocarbons such as chloroform; chlorofluorocarbons such as dichlorodifluoromethane; hydrochlorofluorocarbons such as 1,1-dichloro-2,2,3,3,3-pentafluoropropane, 1,3-dichloro-1,1,2,2,3-pentafluoropropane, 1-chloro-3,3,3-trifluoropropene, and 1,2-dichloro-3,3,3-trifluoropropene; perfluoroether, and perfluoropolyether.

Examples of the above-described sulfoxide-based solvent include dimethyl sulfoxide.

Examples of the above-described carbonate-based solvent include dimethyl carbonate, ethylmethyl carbonate, diethyl carbonate, and propylene carbonate.

Examples of the above-described alcohols include methanol, ethanol, 1-propanol, 2-propanol, 1-butanol, 2-butanol, isobutanol, tert-butanol, 1-pentanol, 2-pentanol, 3-pentanol, 2-methyl-1-butanol, 3-methyl-1-butanol, 2-methyl-2-butanol, 3-methyl-2-butanol, 1-hexanol, 2-hexanol, 3-hexanol, 2-methyl-1-pentanol, 3-methyl-1-pentanol, 4-methyl-1-pentanol, 2-methyl-2-pentanol, 3-methyl-2-pentanol, 4-methyl-2-pentanol, 2-methyl-3-pentanol, 3-methyl-3-pentanol, 2,2-dimethyl-1-butanol, 3,3-dimethyl-1-butanol, 3,3-dimethyl-2-butanol, 2-ethyl-1-butanol, 1-heptanol, 2-heptanol, 3-heptanol, 4-heptanol, benzyl alcohol, 1-octanol, isooctanol, 2-ethyl-1-hexanol, and 4-methyl-2-pentanol.

Examples of the above-described derivative of polyhydric alcohol, which do not have an OH group, include ethylene glycol dimethyl ether, ethylene glycol diethyl ether, ethylene glycol dibutyl ether, ethylene glycol monomethyl ether acetate, ethylene glycol monoethyl ether acetate, ethylene glycol monobutyl ether acetate, ethylene glycol diacetate, diethylene glycol dimethyl ether, diethylene glycol ethyl methyl ether, diethylene glycol diethyl ether, diethylene glycol butyl methyl ether, diethylene glycol dibutyl ether, diethylene glycol monomethyl ether acetate, diethylene glycol monoethyl ether acetate, diethylene glycol monobutyl ether acetate, diethylene glycol diacetate, triethylene glycol dimethyl ether, triethylene glycol diethyl ether, triethylene glycol dibutyl ether, triethylene glycol butyl methyl ether, triethylene glycol monomethyl ether acetate, triethylene glycol monoethyl ether acetate, triethylene glycol monobutyl ether acetate, triethylene glycol diacetate, tetraethylene glycol dimethyl ether, tetraethylene glycol diethyl ether, tetraethylene glycol dibutyl ether, tetraethylene glycol monomethyl ether acetate, tetraethylene glycol monoethyl ether acetate, tetraethylene glycol monobutyl ether acetate, tetraethylene glycol diacetate, propylene glycol dimethyl ether, propylene glycol diethyl ether, propylene glycol dibutyl ether, propylene glycol monomethyl ether acetate, propylene glycol monoethyl ether acetate, propylene glycol monobutyl ether acetate, propylene glycol diacetate, dipropylene glycol dimethyl ether, dipropylene glycol methyl propyl ether, dipropylene glycol diethyl ether, dipropylene glycol dibutyl ether, dipropylene glycol monomethyl ether acetate, dipropylene glycol monoethyl ether acetate, dipropylene glycol monobutyl ether acetate, dipropylene glycol diacetate, tripropylene glycol dimethyl ether, tripropylene glycol diethyl ether, tripropylene glycol dibutyl ether, tripropylene glycol monomethyl ether acetate, tripropylene glycol monoethyl ether acetate, tripropylene glycol monobutyl ether acetate, tripropylene glycol diacetate, tetrapropylene glycol dimethyl ether, tetrapropylene glycol monomethyl ether acetate, tetrapropylene glycol diacetate, butylene glycol dimethyl ether, butylene glycol monomethyl ether acetate, butylene glycol diacetate, glycerin triacetate, 3-methoxybutyl acetate, 3-methyl-3-methoxybutyl acetate, and 3-methyl-3-methoxybutyl propionate.

Examples of the above-described nitrogen element-containing solvent include formamide, N,N-dimethylformamide, N,N-dimethylacetamide, N-methyl-2-pyrrolidone, N-ethyl-2-pyrrolidone, N-propyl-2-pyrrolidone, 1,3-dimethyl-2-imidazolidinone, 1,3-diethyl-2-imidazolidinone, 1,3-diisopropyl-2-imidazolidinone, diethylamine, triethylamine, and pyridine.

Examples of the above-described silicone solvent include hexamethyldisiloxane, octamethyltrisiloxane, decamethyltetrasiloxane, and dodecamethylpentasiloxane.

Examples of the above-described thiols include 1-hexanethiol, 2-methyl-1-pentanethiol, 3-methyl-1-pentanethiol, 4-methyl-1-pentanethiol, 2,2-dimethyl-1-butanethiol, 3,3-dimethyl-1-butanethiol, 2-ethyl-1-butanethiol, 1-heptanethiol, benzylthiol, 1-octanethiol, 2-ethyl-1-hexanethiol, 1-nonanethiol, 1-decanethiol, 1-undecanethiol, 1-dodecanethiol, and 1-tridecanethiol.

The above-described solvent preferably includes an aprotic solvent. A content of the aprotic solvent is, for example, 80% by mass or more, preferably 90% by mass or more in 100% by mass of the above-described solvent. It is more preferable that the above-described solvent is the aprotic solvent, that is, the solvent includes the aprotic solvent in a content of 100% by mass in 100% by mass of the solvent.

Examples of the aprotic solvent hydrocarbons, esters, ethers, ketones, halogen element-containing solvents, sulfoxides, carbonate solvents, derivatives of polyhydric alcohol, nitrogen element-containing solvents, and silicone solvents. These may be used alone or in combination of two or more kinds thereof.

Among these, it is preferable to use one or two or more kinds selected from the group consisting of derivatives of polyhydric alcohol, hydrocarbons, and ethers.

From the viewpoint of cost and solubility, a derivative of polyhydric alcohol (however, those having no OH group in the molecule) are preferable, and for example, diethylene glycol monoethyl ether acetate, ethylene glycol monomethyl ether acetate, propylene glycol monomethyl ether acetate, diethylene glycol dimethyl ether, diethylene glycol ethyl methyl ether, diethylene glycol diethyl ether, diethylene glycol monomethyl ether acetate, diethylene glycol diacetate, triethylene glycol dimethyl ether, ethylene glycol diacetate, ethylene glycol dimethyl ether, 3-methoxy-3-methyl-1-butyl acetate, propylene glycol dimethyl ether, propylene glycol diethyl ether, propylene glycol dibutyl ether, propylene glycol monoethyl ether acetate, propylene glycol monobutyl ether acetate, propylene glycol diacetate, dipropylene glycol dimethyl ether, dipropylene glycol methyl propyl ether, dipropylene glycol diethyl ether, dipropylene glycol dibutyl ether, dipropylene glycol monomethyl ether acetate, dipropylene glycol monoethyl ether acetate, dipropylene glycol monobutyl ether acetate, or dipropylene glycol diacetate is preferable. In addition, propylene carbonate, a linear or branched hydrocarbon solvent having 6 to 12 carbon atoms, p-menthane, diphenylmenthane, limonene, terpinene, bornane, norbornane, pinane, or the like is also preferable.

As an example of the surface treatment agent composition including a silylating agent and a solvent, for example, compositions in which the silylating agent includes one or two or more kinds selected from the group consisting of hexamethyldisilazane, heptamethyldisilazane, N-(trimethylsilyl)dimethylamine, bis(dimethylamino)dimethylsilane, bis(trimethylsilyl)trifluoroacetamide, N-methyl-N-trimethylsilyltrifluoroacetamide, N-trimethylsilylacetamide, N-trimethylsilylimidazole, trimethylsilyltriazole, bistrimethylsilylsulfate, 2,2,5,5-tetramethyl-2,5-disila-1-azacyclopentane, 2,2,4,4,6,6-hexamethylcyclotrisilazane, hexamethyldisiloxane, trimethylsilyltrifluoroacetate, trimethylsilyltrifluoromethanesulfonate, trimethylsilylbenzenesulfonate, and trimethylsilyltoluenesulfonate, and the solvent includes one or two or more kinds selected from the group consisting of propylene carbonate, linear hydrocarbon solvents having 7 to 10 carbon atoms, menthane, pinane, γ-butyrolactone, propylene glycol monomethyl ether acetate, and 3-methoxy-3-methyl-1-butylacetate may be used.

The surface treatment agent composition may not contain water or may contain water in a content of 2% by mass or less in 100% by mass of the surface treatment agent composition. As described above, it is possible to use a surface treatment agent composition which does not substantially contain water.

The above-described surface treatment agent composition can include a component other than the above-described components as long as the object of the present invention is not impaired. Examples of other components include oxidizing agents such as hydrogen peroxide and ozone, surfactants, and antioxidants such as BHT.

The surface treatment agent composition according to the present embodiment is obtained by mixing each of the above-described components. The obtained mixed solution may be purified by using an adsorbent, a filter, or the like, as necessary. In addition, each of the components may be purified in advance by distillation, and then purified using an adsorbent, a filter, or the like.

The embodiments of the present invention have been described above, but these are examples of the present invention and various configurations other than the above can be adopted. In addition, the present invention is not limited to the above-described embodiments, and modifications, improvements, and the like within the range in which the object of the present invention can be achieved are included in the present invention.

EXAMPLES

Hereinafter, the present invention will be described in detail with reference to Examples, but the present invention is not limited to the description of Examples.

<Production of Surface Treatment Agent Composition>

(Surface Treatment Agent Composition 1)

N-(trimethylsilyl)dimethylamine (TMSDMA) and propylene glycol monomethyl ether acetate (PGMEA) were mixed at a liquid temperature of 25° C., and the mixture was stirred for 1 minute to prepare a surface treatment agent composition 1 including 1% by mass of TMSDMA as a silylating agent. For the surface treatment described later, the surface treatment agent composition 1 within 30 minutes after the preparation was used. Hereinafter, "within 30 minutes after the preparation" will be referred to as "immediately after the preparation".

(Surface Treatment Agent Composition 2)

TMSDMA and PGMEA were mixed at a liquid temperature of 25° C., and the mixture was stirred for 1 minute. Further, trifluoroacetic acid (TFA) was added thereto to be reacted with TMSDMA, thereby preparing a surface treatment agent composition 2 including 0.1% by mass of trimethylsilyltrifluoroacetate (TMSTFA) as the compound A and 1% by mass of TMSDMA as the silylating agent. For the surface treatment described later, the surface treatment agent composition 2 immediately after the preparation was used.

(Surface Treatment Agent Composition 3)

A surface treatment agent composition 3 was prepared by preparing in the same manner as in the surface treatment agent composition 2, except that TMSDMA was replaced with hexmethyldisilazane (HMDS). For the surface treatment described later, the surface treatment agent composition 3 immediately after the preparation was used.

(Surface Treatment Agent Compositions 4 to 37)

Surface treatment agent compositions 4 to 37 were prepared by preparing in the same manner as in the surface treatment agent composition 1, 2, or 3 described above, except the raw materials shown in Table 1 were used. For the surface treatment described later, the surface treatment agent compositions 4 to 37 immediately after the preparation were used. Abbreviations and compound names thereof in Table 1 are shown in Table 2.

<Manufacturing of Substrate>

First, a convex structure having a plurality of substantially columnar convex portions which has an aspect ratio of 22 and a pattern width of 19 nm in a cross-sectional view at a pitch of 90 nm (total distance between the width of the convex portion and the adjacent distance between the convex portions) was formed on the surface, and a silicon substrate having a smooth region in which a pattern was not formed on the outer peripheral portion was prepared.

Hereinafter, the portion having the convex structure is referred to as a "pattern formation region" and a smooth portion in which no pattern is formed is referred to as a "pattern non-formation region".

The IPA contact angle and the water contact angle, which will be described later, were measured in the pattern non-formation region, and an area of the pattern non-formation region per measurement point of the contact angle at this time was approximately 250 $mm^2$.

<Surface Treatment of Substrate>

The surface of the above-described substrate was dry-cleaned by $UV/O_3$ irradiation. The surfaces of the pattern formation region and the pattern non-formation region of the above-described substrate were oxidized to be silicon oxide. Subsequently, the substrate was placed on a spin coater, and while rotating the substrate at a speed of 200 rpm, 2-propanol (IPA), the surface treatment agent composition shown in Table 1, and IPA were discharged in this order at a rate of 200 cc/min. Thereafter, the substrate was dried while discharging $N_2$ onto the substrate.

In Comparative Example 1, the above-described discharge with the surface treatment agent composition was not performed, and other than that, the same treatment as in Examples was performed.

TABLE 1-1

| Surface treatment agent composition | Raw material: Component other than solvent: Type | Component other than solvent: % by mass | Solvent: Type | Solvent: % by mass |
|---|---|---|---|---|
| 1 | TMSDMA | 1.0 | PGMEA | 99.0 |
| 2 | TMSDMA, TFA | 1.1, 0.1 | PGMEA | 98.8 |
| 3 | HMDS, TFA | 1.1, 0.1 | PGMEA | 98.8 |
| 4 | TMSTFA, TMS-TMG | 5.6, 0.4 | PGMEA | 94.0 |
| 5 | MSTFA, tBu-TMG | 6.0, 0.4 | Decane | 93.6 |
| 6 | Me3SiOCH3, methanesulfonic acid | 10.0, 0.5 | DiAE | 89.5 |
| 7 | MeSi(OCH3)3, methanesulfonic acid | 10.0, 0.5 | DiAE | 89.5 |
| 8 | HSiMe2OC2H5, methanesulfonic acid | 10.0, 0.5 | DiAE | 89.5 |
| 9 | Me3SiOC6H13, CF3S(═O)2O—Si(CH3)3 | 10.0, 0.5 | Decane | 89.5 |
| 10 | Me3Si—OC6H13, trifluoromethanesulfonic acid | 10.0, 0.01 | Decane | 89.99 |
| 11 | Me3Si—OMe, trifluoromethanesulfonic acid | 10.0, 10.0 | nPA | 80.0 |
| 12 | C8H17SiMe2OMe, trifluoromethanesulfonic acid | 10.0, 0.5 | DiAE | 89.5 |
| 13 | Hexamethyldisiloxane, trifluoromethanesulfonic acid | 5.0, 1.5 | Decane + PGMEA | 50, 43.5 |
| 14 | DBTMDS, (CF3CO)2O | 11.3, 9.2 | Decane + TPGDME | 69.5, 10.0 |
| 15 | DOTMDS, (CF3CO)2O | 13.1, 7.4 | DiAE + TPGDME | 69.5, 10.0 |
| 16 | HMDS, (CF3CO)2O | 9.2, 11.3 | Isododecane | 79.5 |
| 17 | HMDS, (CF3CO)2O | 1.0, 0.1 | PGMEA | 98.9 |
| 18 | TMSDMA, (CF3CO)2O | 2.7, 0.7 | PGMEA | 96.6 |
| 19 | HMDS, TMS-Cl | 1.0, 0.1 | PGMEA | 98.9 |
| 20 | ((CF3CH2CH2)Me2Si)2NH, TMSTFA | 1.0, 0.1 | PGMEA | 98.9 |
| 21 | (PhMe2Si)2NH, TMSTFA | 1.0, 0.1 | PGMEA | 98.9 |
| 22 | TMSDEA, TMSTFA | 1.0, 0.1 | PGMEA | 98.9 |
| 23 | TMSDMA, TMSTFA | 1.0, 0.1 | PGMEA | 98.9 |
| 24 | HMDS, TMSTFA | 10.0, 0.1 | PGMEA | 89.9 |
| 25 | HMDS | 10.0 | PGMEA | 90.0 |
| 26 | TMDS | 10.0 | nPA | 90.0 |
| 27 | TMSDMA | 10.0 | PGMEA | 90.0 |
| 28 | TMSDMA | 5.0 | Diethyl carbonate | 95.0 |
| 29 | TMSDMA | 0.1 | Decane | 99.9 |
| 30 | HMDS, TMSIm, (CF3CO)2O | 8.7, 0.2, 11.3 | Isododecane | 79.8 |
| 31 | MSTFA, DBU | 6.0, 0.4 | PGMEA | 93.6 |
| 32 | MSTFA, Im, TMS-Cl | 6.0, 0.2, 0.01 | PGMEA | 93.79 |
| 33 | MSTFA, N—MeIm | 6.0, 0.2 | PGMEA | 93.8 |
| 34 | TMSIm, TMSTFA | 1.0, 0.1 | PGMEA | 98.9 |
| 35 | TMS-TFA, DBN | 5.6, 0.3 | PGMEA | 94.1 |
| 36 | BSTFA, 2-MeIm | 3.9, 0.2 | PGMEA | 95.9 |
| 37 | TMSTFA, TMS-amide, N—MeIm | 10.0, 9.9, 0.1 | PGMEA | 80.0 |

TABLE 1-2

| Surface treatment agent composition | Surface treatment composition | | | |
|---|---|---|---|---|
| | Silylating agent | | Catalyst | |
| | Type | % by mass | Type | % by mass |
| 1 | TMSDMA | 1.0 | | |
| 2 | TMSDMA | 1.0 | TMSTFA | 0.1 |
| 3 | HMDS | 1.0 | TMSTFA | 0.1 |
| 4 | TMSTFA | 5.6 | TMS-TMG | 0.4 |
| 5 | MSTFA | 6.0 | tBu-TMG | 0.4 |
| 6 | Me3SiOCH3 | 10.0 | Methanesulfonic acid | 0.5 |
| 7 | MeSi(OMe)3 | 10.0 | Methanesulfonic acid | 0.5 |
| 8 | HSiMe2OC2H5 | 10.0 | Methanesulfonic acid | 0.5 |
| 9 | Me3SiOC6H13 | 10.0 | CF3S(═O)2OSiMe3 | 0.5 |
| 10 | Me3SiOC6H13 | 10.0 | Trifluoromethanesulfonic acid | 0.01 |
| 11 | Me3SiOMe | 10.0 | Trifluoromethanesulfonic acid | 10.0 |
| 12 | C8H17SiMe2OMe | 10.0 | Trifluoromethanesulfonic acid | 0.5 |
| 13 | Hexamethyldisiloxane | 5.0 | Trifluoromethanesulfonic acid | 1.5 |
| 14 | DBTMDS | 10.0 | BDMSTFA | 0.5 |
| 15 | DOTMDS | 10.0 | ODMSTFA | 0.5 |
| 16 | HMDS | 0.5 | TMSTFA | 10.0 |
| 17 | HMDS | 0.9 | TMSTFA | 0.1 |
| 18 | TMSDMA | 2.3 | TMSTFA | 0.5 |
| 19 | HMDS | 1.0 | TMS-Cl | 0.1 |
| 20 | ((CF3CH2CH2)Me2Si)2NH | 1.0 | TMSTFA | 0.1 |
| 21 | (PhMe2Si)2NH | 1.0 | TMSTFA | 0.1 |
| 22 | TMSDEA | 1.0 | TMSTFA | 0.1 |
| 23 | TMSDMA | 1.0 | TMSTFA | 0.1 |
| 24 | HMDS | 10.0 | TMSTFA | 0.1 |
| 25 | HMDS | 10.0 | | |
| 26 | TMDS | 10.0 | | |
| 27 | TMSDMA | 10.0 | | |
| 28 | TMSDMA | 5.0 | | |
| 29 | TMSDMA | 0.1 | | |
| 30 | TMSIm | 0.2 | TMSTFA | 10.0 |
| 31 | MSTFA | 6.0 | DBU | 0.4 |
| 32 | MSTFA | 6.0 | Im, TMS-Cl | 0.2, 0.01 |
| 33 | MSTFA | 6.0 | N—MeIm | 0.2 |
| 34 | TMSIm | 1.0 | TMSTFA | 0.1 |
| 35 | TMSTFA | 5.6 | DBN | 0.3 |
| 36 | BSTFA | 3.9 | 2-MeIm | 0.2 |
| 37 | TMSTFA, TMS-amide | 10.0, 9.9 | N—MeIm | 0.1 |

TABLE 2

| Abbreviation | Chemical name |
|---|---|
| TMSTFA | trifluoroacetic acid trimethylsilyl ester |
| TMS-TMG | N-(trimethylsilyl)-tetramethylguanidine |
| MSTFA | N-methyl-N-trimethylsilyltrifluoroacetamide |
| tBu-TMG | N-(tert-butyl)-diphenylguanidine |
| DBTMDS | 1,3-di-n-butyl-1,1,3,3-tetramethyldisilazane |
| DOTMDS | 1,3-di-n-octyl-1,1,3,3-tetramethyldisilazane |
| HMDS | 1,1,1,3,3,3-hexamethyldisilazane |
| TMSDMA | N-(trimethylsilyl)-dimethylamine |
| TMS-Cl | chlorotrimethylsilane |
| TMSDEA | N-(trimethylsilyl)-dimethylamine |
| TMDS | 1,1,3,3-tetramethyldisilazane |
| TMSIm | N-(trimethylsilyl)-imidazole |
| DBU | 1,8-diazabicyclo[5.4.0]-7-undecene |
| Im | imidazole |
| N—MeIm | N-methyl-imidazole |
| DBN | 1,5-diazabicyclo[4.3.0]-5-nonene |
| BSTFA | N,O-bis(trifluoromethyl)trifluoroacetamide |
| 2-MeIm | 2-methyl-imidazole |
| TMS-amide | N-(trimethylsilyl)-trifluoroacetamide |
| PGMEA | propylene glycol monomethyl ether acetate |
| DiAE | Diisoamylether |
| nPA | 1-propanol |
| TPGDME | Tripropylene glycol dimethyl ether |
| BDMSTFA | n-butyldimethylsilyl trifluoroacetate |
| ODMSTFA | n-octyldimethylsilyl trifluoroacetate |

In the table, Me represents a methyl group (—CH3).

<Evaluation>

(IPA Contact Angle)

At the room temperature of 25° C., approximately 1 μL of 2-propanol (IPA) was dropped on the pattern non-formation region with the silicon substrate after the surface treatment set on a contact angle meter and placed on a horizontal table, a state of the droplet after 5 seconds was observed, and a contact angle (°) with IPA at this time was measured as an IPA contact angle. The IPA contact angles are shown in Table 3.

(Water Contact Angle)

At the room temperature of 25° C., using the same substrate used in the above-described measurement of the IPA contact angle, approximately 1 μL of pure water was dropped on the pattern non-formation region with the silicon substrate after the surface treatment set on a contact angle meter and placed on a horizontal table, a state of the droplet after 5 seconds was observed, and a contact angle (°) with pure water at this time was measured as a water contact angle. The water contact angles are shown in Table 3.

(Pattern Collapse Rate)

Further, using the same substrate used in the above-described measurement of contact angle, in the pattern formation region, the number of convex portions where the pattern collapse occurred was counted by observing with an electron microscope (SEM, SU8010 manufactured by Hitachi High-Tech Corporation) at a magnification such that the convex portions were in a field of view of 500 to 600 lines. Table 3 shows a proportion of the convex portions in which the collapse occurred to the total convex portion as a pattern collapse rate (%).

TABLE 3

| | Surface treatment agent composition | Evaluation result Water contact angle [°] | IPA contact angle [°] | Pattern collapse rate [%] |
|---|---|---|---|---|
| Example 1 | 1 | 75 | 4 | 6 |
| Example 2 | 2 | 89 | 5 | 5 |
| Example 3 | 3 | 85 | 4 | 5 |
| Example 4 | 4 | 93 | 5 | 5 |
| Example 5 | 5 | 84 | 4 | 5 |
| Example 6 | 6 | 76 | 4 | 6 |
| Example 7 | 7 | 60 | 2 | 8 |
| Example 8 | 8 | 80 | 4 | 5 |
| Example 9 | 9 | 92 | 5 | 5 |
| Example 10 | 10 | 84 | 4 | 5 |
| Example 11 | 11 | 72 | 3 | 7 |
| Example 12 | 12 | 60 | 2 | 21 |
| Example 13 | 13 | 88 | 5 | 5 |
| Example 14 | 14 | 100 | 6 | 13 |
| Example 15 | 15 | 104 | 6 | 13 |
| Example 16 | 16 | 90 | 5 | 5 |
| Example 17 | 17 | 82 | 4 | 5 |
| Example 18 | 18 | 92 | 5 | 5 |
| Example 19 | 19 | 78 | 4 | 6 |
| Example 20 | 20 | 84 | 4 | 8 |
| Example 21 | 21 | 86 | 5 | 5 |
| Example 22 | 22 | 84 | 4 | 5 |
| Example 23 | 23 | 82 | 4 | 5 |
| Example 24 | 24 | 88 | 5 | 5 |
| Example 25 | 25 | 56 | 2 | 9 |
| Example 26 | 26 | 71 | 3 | 7 |
| Example 27 | 27 | 80 | 4 | 5 |
| Example 28 | 28 | 79 | 4 | 5 |
| Example 29 | 29 | 71 | 3 | 11 |
| Example 30 | 30 | 93 | 5 | 5 |
| Example 31 | 31 | 93 | 5 | 5 |
| Example 32 | 32 | 93 | 5 | 5 |
| Example 33 | 33 | 94 | 5 | 5 |
| Example 34 | 34 | 82 | 4 | 5 |
| Example 35 | 35 | 96 | 6 | 5 |
| Example 36 | 36 | 57 | 2 | 9 |
| Example 37 | 37 | 88 | 5 | 5 |
| Comparative Example 1 | Not treated | <1 | <1 | 100 |

As described above, since it can be confirmed a predetermined IPA contact angle and/or a predetermined water contact angle could be exhibited, the surface treatment method according to Examples of the present disclosure is a more efficient method than the conventional method of separately evaluating using a smooth dummy substrate.

In addition, as shown in Table 1, in Examples 1 to 37 using the surface treatment agent compositions 1 to 37, the IPA contact angle of a predetermined value or more and the water contact angle of a predetermined value or more were exhibited in the pattern non-formation region of the substrate. As shown in Table 1, a corresponding portion in the convex portion of the pattern formation region of the substrate remains even after the cleaning or drying process, and the result that the pattern collapse rate could be reduced as compared with Comparative Example 1 was shown.

Priority is claimed on Japanese Patent Application No. 2020-089194, filed May 21, 2020, and Japanese Patent Application No. 2020-089201, filed May 21, 2020, the disclosures of which are incorporated herein by reference.

REFERENCE SIGNS LIST

10: substrate
12: main surface
14: notch portion
16: back surface
20: concave-convex structure
22: convex portion
24: concave portion
30: pattern formation region
32: pattern non-formation region
50: bevel region
51: top edge
52: upper bevel
53: front shoulder
54: end face
55: lower bevel
60: surface treatment agent composition
70: surface treatment agent layer

The invention claimed is:

1. A treatment method of treating a main surface of a semiconductor substrate that has, on the main surface of the substrate, a pattern formation region in which a pattern having a concave-convex structure with a pattern dimension of 30 nm or less is formed and a pattern non-formation region in which no pattern is formed, the method comprising:

a surface treatment step of bringing a surface treatment agent composition including a silylating agent and a solvent into contact with the pattern formation region and the pattern non-formation region on the main surface of the semiconductor substrate, and an evaluation step of determining whether or not, with respect to a surface of the pattern non-formation region after the surface treatment step, an IPA contact angle with 2-propanol is 2° or more at a room temperature of 25° C. and/or a water contact angle with pure water is 50° or more at the room temperature of 25° C., which is obtained by dropping 1 μl of droplets of 2-propanol or pure water on the substrate surface of the pattern non-formation region at the room temperature of 25° C. in a state in which the semiconductor substrate is stood on a horizontal table, and then measuring after 5 seconds.

2. The treatment method according to claim 1, wherein the surface treatment step is a step of forming a surface treatment agent layer on an entire main surface of the semiconductor substrate, and on a surface of the surface treatment agent layer, the IPA contact angle is 2° or more at the room temperature of 25° C. and/or the water contact angle is 55° or more at the room temperature of 25° C.

3. The treatment method according to claim 1, wherein the solvent includes an aprotic solvent.

4. The treatment method according to claim 3, wherein the solvent includes the aprotic solvent in a content of 100% by mass in 100% by mass of the solvent.

5. The treatment method according to claim 3, wherein the aprotic solvent includes one or two or more kinds selected from the group consisting of hydrocarbons, esters, ethers, ketones, halogen element-containing solvents, sulfoxides, carbonate solvents, derivatives of polyhydric alcohol, nitrogen element-containing solvents, and silicone solvents.

6. The treatment method according to claim 3, wherein the solvent includes at least one of following (i), (ii) and (iii), (i) a carbonate solvent or a lactone, (ii) propylene carbonate or γ-butyrolactone, and (iii) one or two or more kinds selected from the group consisting of derivatives of polyhydric alcohol, hydrocarbons, and ethers.

7. The treatment method according to claim 1, wherein the silylating agent includes a silicon compound represented by General Formula [1], $R^1_a Si(H)_b X_{4-a-b}$ [1]

(in General Formula [1], $R^1$'s each independently represent an organic group including a hydrocarbon group having 1 to 18 carbon atoms, in which a part or all of hydrogen elements may be replaced with fluorine elements, X's each independently represent a monovalent functional group in which an element bonded to an Si element is nitrogen, oxygen, carbon, or halogen, a represents an integer of 1 to 3, b represents an integer of 0 to 2, and a sum of a and b is 1 to 3).

8. The treatment method according to claim 1, wherein the silylating agent has a trialkylsilyl group, or an element bonded to an Si element, or both are nitrogen.

9. The treatment method according to claim 1, wherein a content of the silylating agent is 0.1% by mass or more and 50% by mass or less in 100% by mass of the surface treatment agent composition.

10. The treatment method according to claim 1, wherein the surface treatment agent composition includes a catalyst.

11. The treatment method according to claim 10, wherein the catalyst includes one or two or more kinds selected from the group consisting of trimethylsilyltrifluoroacetate, trimethylsilyltrifluoromethanesulfonate, dimethylsilyltrifluoroacetate, dimethylsilyltrifluoromethanesulfonate, butyldimethylsilyltrifluoroacetate, butyldimethylsilyltrifluoromethanesulfonate, hexyldimethylsilyltrifluoroacetate, hexyldimethylsilyltrifluoromethanesulfonate, octyldimethylsilyltrifluoroacetate, octyldimethylsilyltrifluoromethanesulfonate, decyldimethylsilyltrifluoroacetate, decyldimethylsilyltrifluoromethanesulfonate, a sulfonic acid represented by General Formula [3], an anhydride of the sulfonic acid, a salt of the sulfonic acid, a sulfonic acid derivative represented by General Formula [4], a sulfonate represented by General Formula [5], a sulfonimide represented by each of General Formulae [6] and [7], a sulfonimide derivative represented by each of General Formulae [8] and [9], a sulfonmethide represented by General Formula [10], a sulfonmethide derivative represented by General Formula [11], an acid imidized product, a nitrogen-containing compound, a nitrogen-containing heterocyclic compound, and a silylated heterocyclic compound, $R^8—S(=O)_2OH$ [3]

[in General Formula [3], $R^8$ represents a group selected from the group consisting of a monovalent hydrocarbon group having 1 to 8 carbon atoms, in which a part or all of hydrogen elements may be replaced with fluorine elements, and a hydroxyl group]

$R^{8'}—S(=O)_2O—Si(H)_{3-r}(R^9)_r$ [4]

[in General Formula [4], $R^{8'}$ represents a monovalent hydrocarbon group having 1 to 8 carbon atoms, in which a part or all of hydrogen elements may be replaced with fluorine elements, $R^9$'s each independently represent at least one group selected from monovalent hydrocarbon groups having 1 to 18 carbon atoms, in which a part or all of hydrogen elements may be replaced with fluorine elements, and r represents an integer of 1 to 3]

$R^{10}—S(=O)_2OR^{11}$ [5]

[in General Formula [5], $R^{10}$ represents a group selected from the group consisting of a monovalent hydrocarbon group having 1 to 8 carbon atoms, in which a part or all of hydrogen elements may be replaced with fluorine elements, and a fluorine element, and $R^{11}$ represents a monovalent alkyl group having 1 to 18 carbon atoms]

$(R^{12}—S(=O)_2)_2NH$ [6]

[in General Formula [6], $R^{12}$'s each independently represent a group selected from the group consisting of a monovalent hydrocarbon group having 1 to 8 carbon atoms, in which a part or all of hydrogen elements may be replaced with fluorine elements, and a fluorine element]

[7]

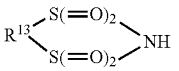

[in General Formula [7], $R^{13}$ represents a divalent hydrocarbon group having 1 to 8 carbon atoms, in which a part or all of hydrogen elements may be replaced with fluorine elements]

$((R^{14}—S(=O)_2)_2N)_sSi(H)_t(R^{15})_{4-s-t}$ [8]

[in General Formula [8], $R^{14}$'s each independently represent a group selected from the group consisting of a monovalent hydrocarbon group having 1 to 8 carbon atoms, in which a part or all of hydrogen elements may be replaced with fluorine elements, and a fluorine element, $R^{15}$'s each independently represent a monovalent hydrocarbon group having 1 to 18 carbon atoms, in which a part or all of hydrogen elements may be replaced with fluorine elements, s represents an integer of 1 to 3, t represents an integer of 0 to 2, and a sum of s and tis 3 or less]

[9]

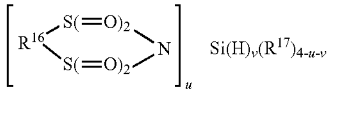

[in General Formula [9], $R^{16}$'s each independently represent a divalent hydrocarbon group having 1 to 8 carbon atoms, in which a part or all of hydrogen elements may be replaced with fluorine elements, $R^{17}$'s each independently represent a monovalent hydrocarbon group having 1 to 18 carbon atoms, in which a part or all of hydrogen elements may be replaced with fluorine elements, u represents an integer of 1 to 3, v represents an integer of 0 to 2, and a sum of u and v is 3 or less]

$(R^{18}—S(=O)_2)_3CH$ [10]

[in General Formula [10], $R^{18}$'s each independently represent a group selected from the group consisting of a monovalent hydrocarbon group having 1 to 8 carbon atoms, in which a part or all of hydrogen elements may be replaced with fluorine elements, and a fluorine element]

$$((R^{19}—S(=O)_2)_3C)_wSi(H)_x(R^{20})_{4-w-x} \quad [11]$$

[in General Formula [11], $R^{19}$'s each independently represent a group selected from the group consisting of a monovalent hydrocarbon group having 1 to 8 carbon atoms, in which a part or all of hydrogen elements may be replaced with fluorine elements, and a fluorine element, $R^{20}$'s each independently represent a monovalent hydrocarbon group having 1 to 18 carbon atoms, in which a part or all of hydrogen elements may be replaced with fluorine elements, w represents an integer of 1 to 3, x represents an integer of 0 to 2, and a sum of w and x is 3 or less].

12. The treatment method according to claim 10, wherein a content of the catalyst is 0.005% by mass or more and 20% by mass or less in 100% by mass of the surface treatment agent composition.

13. The treatment method according to claim 1, wherein the surface treatment agent composition does not contain water or contains water in a content of 2% by mass or less in 100% by mass of the surface treatment agent composition.

14. The treatment method according to claim 1, further comprising, after the surface treatment step:

a drying step of drying the main surface of the semiconductor substrate.

15. The treatment method according to claim 1, further comprising, after the surface treatment step:

a removal step of removing a surface treatment agent layer formed on the main surface of the semiconductor substrate from the main surface, the surface treatment agent layer being formed by the surface treatment step.

* * * * *